(12) United States Patent  (10) Patent No.: US 7,568,918 B2
Uratsuji et al.  (45) Date of Patent: Aug. 4, 2009

(54) SOCKET FOR SEMICONDUCTOR DEVICE

(75) Inventors: Kazumi Uratsuji, Tokyo (JP); Hideki Sato, Chiba (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 12/239,211

(22) Filed: Sep. 26, 2008

(65) Prior Publication Data

US 2009/0088006 A1  Apr. 2, 2009

(30) Foreign Application Priority Data

Sep. 28, 2007  (JP) ............... 2007-256211

(51) Int. Cl.
 *H01R 12/00* (2006.01)
(52) U.S. Cl. ...................... 439/73; 439/331
(58) Field of Classification Search .......... 439/73, 439/263–268, 330, 331, 68, 71–72
 See application file for complete search history.

(56) References Cited

U.S. PATENT DOCUMENTS

| | | |
|---|---|---|
| 4,420,205 A | 12/1983 | Kirkman |
| 4,739,257 A | 4/1988 | Jenson et al. |
| 4,927,369 A | 5/1990 | Grabbe et al. |
| 5,073,117 A | 12/1991 | Malhi et al. |
| 5,147,213 A | 9/1992 | Funk et al. |
| 5,249,972 A | 10/1993 | Walker |
| 5,281,160 A | 1/1994 | Walkup et al. |
| 5,342,213 A | 8/1994 | Kobayashi |
| 5,342,214 A | 8/1994 | Hsu |
| 5,458,499 A | 10/1995 | Matsuoka |
| 5,482,471 A | 1/1996 | Mori et al. |
| 5,518,410 A | 5/1996 | Masami |
| 5,519,882 A | 5/1996 | Asano et al. |
| 5,531,608 A | 7/1996 | Abe |
| 5,573,427 A | 11/1996 | Sagano |
| 5,611,705 A | 3/1997 | Pfaff |
| 5,727,954 A | 3/1998 | Kato et al. |
| 5,807,104 A | 9/1998 | Ikeya et al. |
| 5,885,101 A | 3/1999 | Matsuoka et al. |
| 5,923,179 A | 7/1999 | Taylor |
| 5,989,039 A | 11/1999 | Sik |

(Continued)

FOREIGN PATENT DOCUMENTS

EP  0 969 710 A2  1/2000

(Continued)

OTHER PUBLICATIONS

Office Action dated Dec. 26, 2008 in corresponding Japanese Patent Application No. 2006-043171.
Office Action dated Oct. 23, 2007 in corresponding Japanese Patent Application No. 2004-253342.
Official Action from German Patent Office for corresponding German Patent Application No. 10223502.3-55.
Official Letter from Korean Patent Office, dated Sep. 18, 2004, for corresponding Korean Patent Application No. 10-2002-0038155.

*Primary Examiner*—Khiem Nguyen
(74) *Attorney, Agent, or Firm*—Finnegan, Henderson, Farabow, Garrett & Dunner, LLP

(57) ABSTRACT

A pressing surface portion of a presser member for selectively holding a semiconductor device is supported to be movable upward and downward in accordance with the up/down motion of a cover member to be close to or away from a alignment plate, as well as to be rotatable between a position directly above the alignment plate and a predetermined waiting position.

8 Claims, 19 Drawing Sheets

U.S. PATENT DOCUMENTS

| | | |
|---|---|---|
| 6,027,355 A | 2/2000 | Ikeya |
| 6,126,467 A | 10/2000 | Ohashi |
| 6,149,449 A | 11/2000 | Abe |
| 6,155,859 A | 12/2000 | Choy |
| 6,162,066 A | 12/2000 | Glick et al. |
| 6,213,806 B1 | 4/2001 | Choy |
| 6,220,869 B1 | 4/2001 | Grant et al. |
| 6,243,267 B1 | 6/2001 | Chuang |
| 6,261,114 B1 | 7/2001 | Shimada |
| 6,280,219 B1 | 8/2001 | Sano et al. |
| 6,280,222 B1 | 8/2001 | Walkup |
| 6,283,780 B1 | 9/2001 | Yamamoto et al. |
| 6,296,505 B1 | 10/2001 | Fukunaga et al. |
| 6,322,384 B1 | 11/2001 | Ikeya |
| 6,328,587 B1 | 12/2001 | Hsu |
| 6,350,138 B1 | 2/2002 | Atobe et al. |
| 6,371,782 B1 | 4/2002 | Ohashi |
| 6,383,002 B1 | 5/2002 | Ohashi |
| 6,402,537 B2 | 6/2002 | Ikeya |
| 6,443,741 B1 | 9/2002 | Watanabe |
| 6,461,182 B1 | 10/2002 | Hsu |
| 6,464,511 B1 | 10/2002 | Watanabe et al. |
| 6,517,370 B2 | 2/2003 | Fukunaga |
| 6,561,831 B1 | 5/2003 | McHugh et al. |
| 6,567,866 B1 | 5/2003 | Poisner |
| 6,609,923 B2 | 8/2003 | Sato et al. |
| 6,676,431 B2 | 1/2004 | Kukita et al. |
| 6,707,309 B2 | 3/2004 | Sato et al. |
| 6,709,279 B2 | 3/2004 | Uratsuji |
| 6,733,320 B2 | 5/2004 | Kukita et al. |
| 6,739,894 B2 | 5/2004 | Ogura |
| 6,752,645 B2 | 6/2004 | Nakamura et al. |
| 6,758,684 B2 | 7/2004 | Oikawa et al. |
| 6,776,641 B2 | 8/2004 | Hachuda |
| 6,776,643 B2 | 8/2004 | Nakano |
| 6,793,512 B2 | 9/2004 | Abe et al. |
| 6,796,823 B1 | 9/2004 | Nakano et al. |
| 6,960,092 B1 | 11/2005 | Hussain et al. |
| 6,976,852 B2 | 12/2005 | Azumi et al. |
| 6,976,863 B2 | 12/2005 | Sato |
| 7,118,386 B2 | 10/2006 | Sato et al. |
| 7,165,978 B2 | 1/2007 | Sato et al. |
| 7,204,708 B2 | 4/2007 | Sato et al. |
| 2004/0248435 A1 | 12/2004 | Sato et al. |
| 2004/0253862 A1 | 12/2004 | Masaki et al. |
| 2006/0043990 A1 | 3/2006 | Sato |
| 2006/0228915 A1 | 10/2006 | Sato et al. |
| 2007/0007984 A1 | 1/2007 | Kojima et al. |

FOREIGN PATENT DOCUMENTS

| | | |
|---|---|---|
| EP | 0 969 711 A2 | 1/2000 |
| EP | 1 111 724 A2 | 6/2001 |
| JP | 57-125632 | 1/1984 |
| JP | 60-189977 | 12/1985 |
| JP | 62-160676 | 7/1987 |
| JP | 63-299257 | 12/1988 |
| JP | 01-81887 | 5/1989 |
| JP | 02-049381 | 2/1990 |
| JP | 02-119378 | 9/1990 |
| JP | 04-072927 | 3/1992 |
| JP | 04-135190 | 5/1992 |
| JP | 04-308676 | 10/1992 |
| JP | 05-11374 | 2/1993 |
| JP | 05-029050 | 2/1993 |
| JP | 05-047445 | 2/1993 |
| JP | 05-020286 | 3/1993 |
| JP | 06-020752 | 1/1994 |
| JP | 06-020753 | 1/1994 |
| JP | 06-203936 | 7/1994 |
| JP | 06-290839 | 10/1994 |
| JP | 07-239362 | 9/1995 |
| JP | 08-046335 | 2/1996 |
| JP | 08-138812 | 5/1996 |
| JP | 8-213088 | 8/1996 |
| JP | 08-222335 | 8/1996 |
| JP | 09-55273 | 2/1997 |
| JP | 09-092421 | 4/1997 |
| JP | 2665419 B2 | 6/1997 |
| JP | 09-199217 | 7/1997 |
| JP | 09-199250 | 7/1997 |
| JP | 09-211067 | 8/1997 |
| JP | 09-245920 | 9/1997 |
| JP | 10-073635 | 3/1998 |
| JP | 10-256764 | 9/1998 |
| JP | 10-302925 | 11/1998 |
| JP | 11-02126 | 1/1999 |
| JP | 11-097818 | 4/1999 |
| JP | 11-126671 | 5/1999 |
| JP | 11-238566 | 8/1999 |
| JP | 02-973406 | 9/1999 |
| JP | 11-329643 | 11/1999 |
| JP | 2000-113954 | 4/2000 |
| JP | 2000-133390 | 5/2000 |
| JP | 2000-150092 | 5/2000 |
| JP | 2000-182739 | 6/2000 |
| JP | 2000-182740 | 6/2000 |
| JP | 03-072548 | 8/2000 |
| JP | 2000-340324 A | 12/2000 |
| JP | 2001-043462 | 2/2001 |
| JP | 2001-043947 | 2/2001 |
| JP | 2001-066346 | 3/2001 |
| JP | 2001-91577 | 4/2001 |
| JP | 2001-115037 | 4/2001 |
| JP | 2001-151234 | 5/2001 |
| JP | 2001-185313 | 7/2001 |
| JP | 2001-326045 | 11/2001 |
| JP | 2001-522523 | 11/2001 |
| JP | 03-257994 | 12/2001 |
| JP | 2002-063975 | 2/2002 |
| JP | 2002-202344 | 7/2002 |
| JP | 2002-202729 | 7/2002 |
| JP | 2002-231398 | 8/2002 |
| JP | 2002-313510 | 10/2002 |
| JP | 2002-314005 | 10/2002 |
| JP | 2003-007942 | 1/2003 |
| JP | 2003-17207 | 1/2003 |
| JP | 2003-35745 | 2/2003 |
| JP | 2003-123923 | 4/2003 |
| JP | 2003-123924 | 4/2003 |
| JP | 2003-123925 | 4/2003 |
| JP | 2003-123926 | 4/2003 |
| JP | 2003-217771 | 7/2003 |
| JP | 2003-308940 | 10/2003 |
| JP | 2004-014873 | 1/2004 |
| JP | 2004-79227 | 3/2004 |
| JP | 2004-111215 | 4/2004 |
| JP | 2004-214177 | 7/2004 |
| JP | 2004-227907 | 8/2004 |
| JP | 2004-355983 | 12/2004 |
| JP | 2005-26213 | 1/2005 |
| JP | 2005-37156 | 2/2005 |
| JP | 2005-276843 | 10/2005 |
| JP | 2006-294281 | 10/2006 |
| JP | 2007-17234 | 1/2007 |
| JP | 2007-500426 | 1/2007 |
| JP | 04-109543 B2 | 4/2008 |
| WO | WO 03/030604 | 4/2003 |
| WO | WO 03/031994 | 4/2003 |

SOCKET FOR SEMICONDUCTOR DEVICE

This application claims the benefit of Japanese Patent Application No. 2007-256211, filed Sep. 28, 2007, which is hereby incorporated by reference herein in its entirety.

BACKGROUND OF THE INVENTION

1. Field of the Invention

The present invention relates to a socket for a semiconductor device provided with a holding mechanism for selectively holding a semiconductor device in a releasable manner.

2. Description of the Related Art

A semiconductor device mounted to electronic equipment or others is subjected to various tests at a stage prior to being mounted thereto to remove latent defects thereof. Such tests are carried out while the semiconductor device is mounted to a socket for the semiconductor device, for example.

The socket for the semiconductor device made available for such tests is generally referred to as an IC socket and arranged on a printed wiring board having an input/output portion. The input/output portion is supplied with a predetermined test voltage and supplies an abnormal detection signal representing, for example, a short-circuit from the semiconductor device as an object to be tested.

As disclosed in Japanese Patent Laid-Open No. 2004-79227, the socket for the semiconductor device of an open-top type, for example, includes a socket body disposed on a printed wiring board (not shown), the socket body for accommodating a contact terminal group for electrically connecting the semiconductor device to the printed wiring board, a positioning member (in Japanese Patent Laid-Open No. 2004-79227, referred to as a positioning mechanism) having an accommodation portion wherein the semiconductor device is accommodated, disposed at a position above the contact terminal group in the socket body, a latch mechanism as a holding mechanism for selectively holding the semiconductor device relative to the accommodation portion of the positioning member, having a pair of presser members (in Japanese Patent Laid-Open No. 2004-79227, referred to as a latch) and arranged on the periphery of the positioning member, and a cover member (in Japanese Patent Laid-Open No. 2004-79227, referred to as an operating member) for transmitting the operating force applied thereto to the latch mechanism via a predetermined driving mechanism so that the presser member is operated.

The cover member has an opening at a center thereof for allowing the semiconductor device to pass therethrough when the semiconductor device is attached to or detached from the accommodation portion of the positioning member. The cover member is disposed so as to move up and down relative to the socket body, and is coupled to a driving mechanism. The driving mechanism is, for example, a link mechanism or a cam mechanism for coupling the cover member to a proximal end of the presser member of the latch mechanism so that the presser member is rotatable in accordance with ascent and descent of the cover member.

The positioning member is fixed to the socket body and determines relative positions of the terminals of the semiconductor device to the contact terminal group of the semiconductor device by positioning the outer periphery of the semiconductor device mounted into the accommodation portion of the socket body.

The pair of presser members in the latch mechanism are disposed opposite to each other with the intervention of the mounted semiconductor device therebetween, respectively. The presser member includes a proximal end supported rotative movably by the socket body and coupled to the above-mentioned driving mechanism, a contacting portion selectively brought into contact with or apart from the outer periphery of the semiconductor device, and a coupled portion for coupling the proximal end to the contacting portion.

When the semiconductor device is mounted into the accommodation portion, the contacting portion of the presser member occupies a waiting position apart from the accommodation portion not to interfere with the semiconductor device, and after the semiconductor device has been mounted in the accommodation portion, the a contacting portion of the presser member enters the accommodation portion and occupies a holding position.

In this structure, when the semiconductor device is mounted to the accommodation portion of the positioning member through the opening of the cover member, the cover member is pressed from an upper position to a lower position relative to the socket body and the positioning member at a predetermined stroke and held there, and the contacting portions of the above-mentioned pair of presser members are apart from each other relative to the accommodation portion of the positioning member to occupy the waiting position, whereby the mounting of the semiconductor device into the accommodation portion becomes possible.

Then, if the cover member is released from the held state, the cover member moves upward by a force of a biasing member to return to its initial position, the pair of presser members become closer to each other from the waiting position to the accommodation portion of the positioning member and are brought into sliding contact with the outer peripheral surface of a package of the semiconductor device so that terminals of the semiconductor device located by the positioning member are pressed toward the contact terminal group. Accordingly, the semiconductor device is held to the accommodation portion of the positioning member.

SUMMARY OF THE INVENTION

When the semiconductor device is mounted to the accommodation portion of the positioning member through the opening of the cover member, the contacting portions of the pair of presser members come closer to each other as they move from the waiting position toward the accommodation portion of the positioning member as described above. At that time, since the contacting portions thereof are brought into sliding contact with the outer peripheral surface of the package of the semiconductor device, and particularly the pressure on the contacting portions becomes higher as the number of contact terminals increases, there may be a risk of the generation of abrasion on the outer peripheral surface of the package of the semiconductor device. Accordingly, there may be cases wherein a conforming semiconductor device is deemed as a defective piece outwardly due to the abrasion on the outer peripheral surface of the package in the visual inspection to lower the yield.

By taking the above-described problem into account, an object of the present invention is to provide a socket for a semiconductor device provided with a holding mechanism for selectively holding a semiconductor device in a releasable manner, capable of holding the semiconductor device without imparting any abrasion on the outer peripheral surface of a package of the semiconductor device.

To achieve the above-mentioned object, a socket for a semiconductor device according to the present invention comprises a socket body having a semiconductor device mounting portion for detachably mounting a semiconductor device and a group of contact terminals electrically connected to terminals of the semiconductor device; a presser member having a pressing surface portion formed generally parallel to a contour surface of the semiconductor device and the presser member being supported in the socket body so that the pressing surface portion is moved in the direction vertical to the contour surface and brought into contact with the contour surface when moving closer to the contour surface of the semiconductor device mounted to the semiconductor device mounting portion or rotated after the pressing surface portion is away from the contour surface; a cover member supported by the socket body to be movable upward and downward and having an opening for allowing the semiconductor device to pass therethrough when the semiconductor device is mounted or demounted; means for biasing cover member in the direction away from the socket body; and a link mechanism coupled to the cover member and the presser member, for holding the pressing surface of the presser member on the contour surface of the semiconductor device or releasing the same therefrom in synchronization with moving up and down of the cover member.

Also, a socket for a semiconductor device according to present invention comprises a socket body having a semiconductor device mounting portion for detachably mounting a semiconductor device and a group of contact terminals electrically connected to terminals of the semiconductor device; a first presser member having a pressing surface portion formed generally parallel to a contour surface of the semiconductor device and the first presser member being supported in the socket body so that the pressing surface portion is moved in the direction vertical to the contour surface and brought into contact with the contour surface when moving closer to the contour surface of the semiconductor device mounted to the semiconductor device mounting portion or rotated after the pressing surface portion is away from the contour surface; a second presser member arranged to be moved closer to or away from the first presser member in synchronization with the operation of the first presser member, the second presser member having a pressing surface portion formed generally parallel to a contour surface of the semiconductor device and the second presser member being supported in the socket body so that the pressing surface portion is moved in the direction vertical to the contour surface and brought into contact with the contour surface when moving closer to the contour surface of the semiconductor device mounted to the semiconductor device mounting portion or rotated after the pressing surface portion is away from the contour surface; a cover member supported by the socket body to be movable upward and downward and having an opening for allowing the semiconductor device to pass therethrough when the semiconductor device is mounted or demounted; means for biasing the cover member in the direction away from the socket body; and a link mechanism coupled to the cover member and the first and second presser members, for holding the pressing surfaces of the presser members on the contour surface of the semiconductor device or releasing the same therefrom in synchronization with moving up and down of the cover member.

According to the socket for a semiconductor of the present invention, the presser member has the pressing surface portion generally parallel to the contour surface of the semiconductor device and is supported in the socket body so that the pressing surface portion is moved in the direction vertical to the contour surface and brought into contact with the contour surface when moving closer to the contour surface of the semiconductor device mounted to the semiconductor device mounting portion or rotated after the pressing surface portion is away from the contour surface, whereby the pressing surface portion does not grind on the contour surface of the semiconductor device. Thus, it is possible to hold the semiconductor device without imparting any abrasion on the outer peripheral surface of the package of the semiconductor device.

Further features of the present invention will become apparent from the following description of exemplary embodiments (with reference to the attached drawings).

DESCRIPTION OF THE EMBODIMENTS

Figure 2:
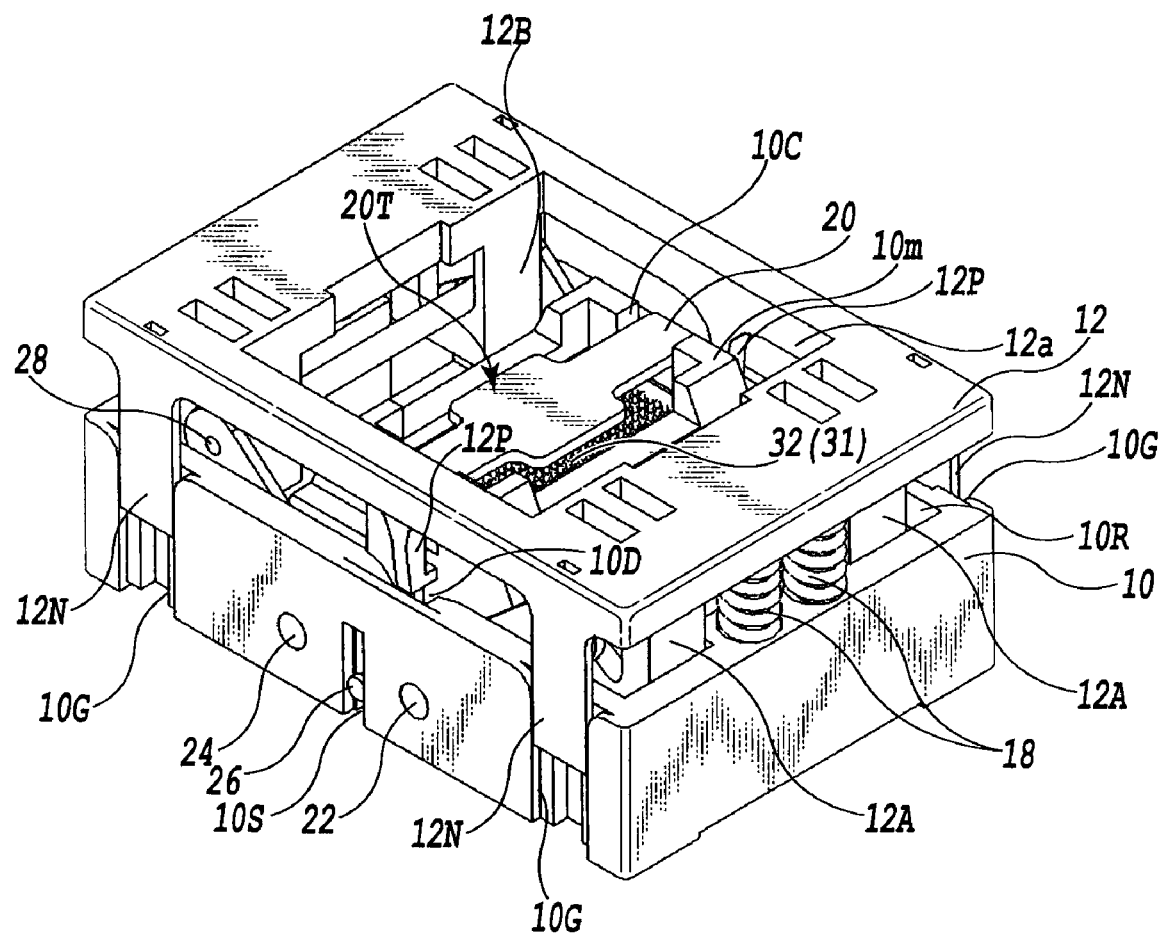
FIG. 2 is a perspective view illustrating an appearance of the first embodiment of the socket for the semiconductor device according to the present invention.

FIG. 2 illustrates enlargedly an appearance of a first embodiment of a socket for a semiconductor device according to the present invention.

Figure 3:
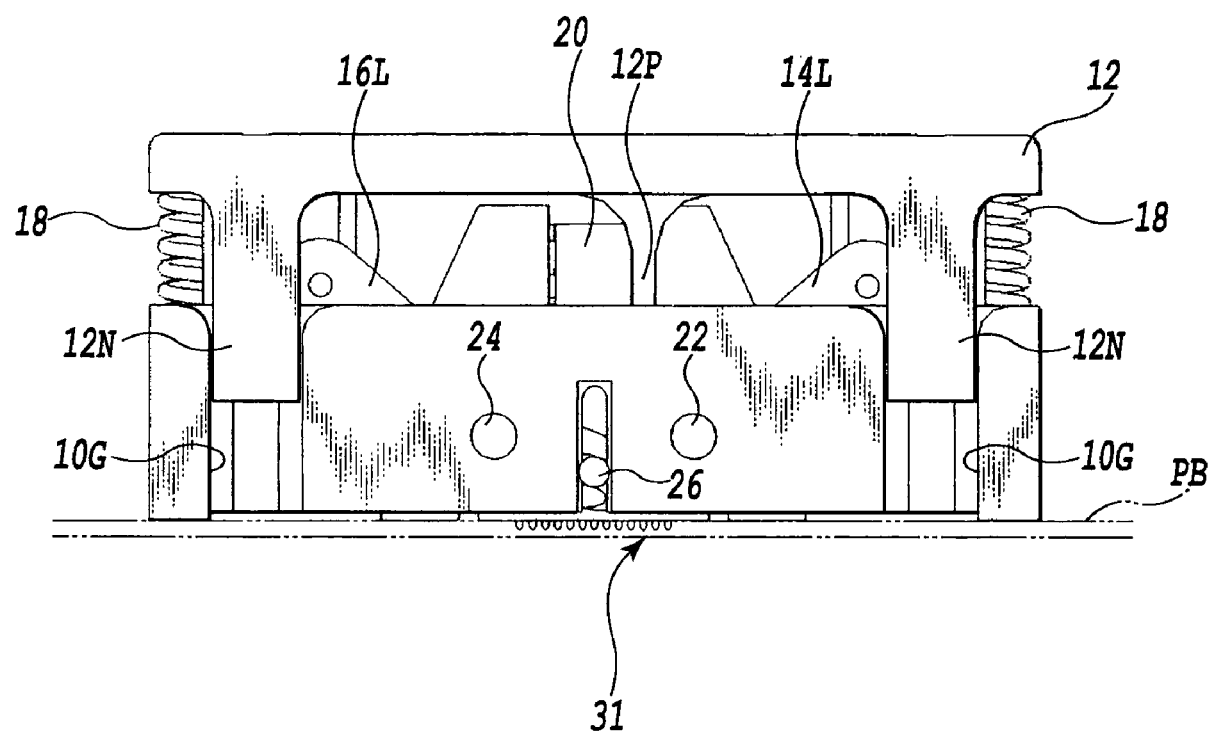
FIG. 3 is a front view of the embodiment shown in FIG. 2.

As shown in FIG. 3, the socket for the semiconductor device is disposed on a printed wiring board PB. The printed wiring board PB has input/output portion supplied with a predetermined test voltage and supplies abnormality detection signals representing such as the short-circuit or the like from the semiconductor device as the respective object to be tested. In this regard, in FIG. 3, one of a plurality of sockets for semiconductor devices lengthwise and crosswise arranged on the printed wiring board PB is solely illustrated as a representative.

In FIG. 2, the socket for the semiconductor device includes, as main elements, a contact pin module 31 for electrically connecting the respective electrode pads (terminal portions) on the printed wiring board PB with terminals of a semiconductor device DV, a socket body 10 having a module accommodation portion 10A for accommodating the contact pin module 31, an alignment plate 32 as a positioning member for locating the respective electrodes of the semiconductor device DV to the respective terminal portions of the contact pin module 31, supported to be movable up and down on an upper portion of the contact pin module 31, a cover member 12 disposed on the socket body 10 to be movable up and down so that a presser member 20 described later selectively comes closer to or away from the alignment plate 32 and rotationally moves, a presser member 20 for pressing the respective terminals of the semiconductor device DV via the alignment plate 32 in accordance with the upward motion of the cover member 12 toward the contact pins of the contact pin module 31 to hold or release the same, and a link mechanism for operating the presser member 20 in association with the up/down motion of the cover member 12.

The semiconductor device DV as an object to be tested has a package of a BGA (ball grid array) type. In the semiconductor device DV, a plurality of bump type electrodes to be connected to the contact pin module 31 via a through-hole of the alignment plate 32 described later are entirely formed as terminals on a surface of the semiconductor device DV opposed to the alignment plate 32 while being arranged at a predetermined interval.

In this regard, the semiconductor device DV should not be limited to that formed of a BGA type package, but may be, for example, that formed of an LGA (land grid array) type package.

On the long side of the outer periphery of the socket body 10, guide grooves 10G engaged with the respective guide nibs 12N described later of the cover member are formed at a predetermined interval to be movable up and down. The guide groove 10G is formed generally perpendicular to the bottom surface of the socket body 10. At one end of the respective groove 10G, a front-end of the guide nib 12N is locked when the cover member 12 is at the uppermost end position as shown in FIG. 2.

A slit 10S, through which passes one end of a coupling pin 26 described later is formed generally parallel to the guide groove 10G between a pair of guide grooves 10G. In FIG. 2, the pair of guide grooves 10G formed on one side of the outer periphery of the socket body 10 are solely illustrated, and a pair of guide grooves 10G formed on the other side are not shown.

Figure 5:
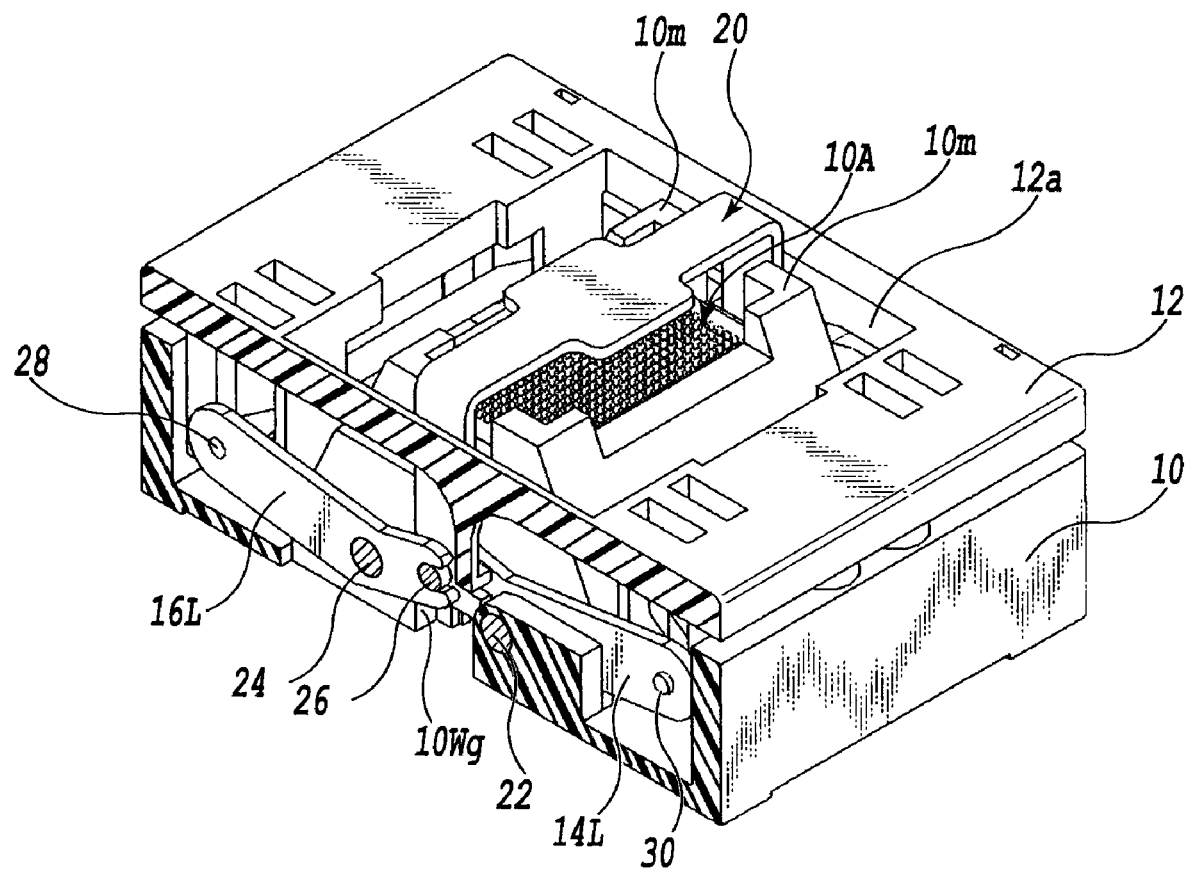
FIG. 5 is a perspective view made available for explaining the operation of the embodiment shown in FIG. 2.
Figure 6:
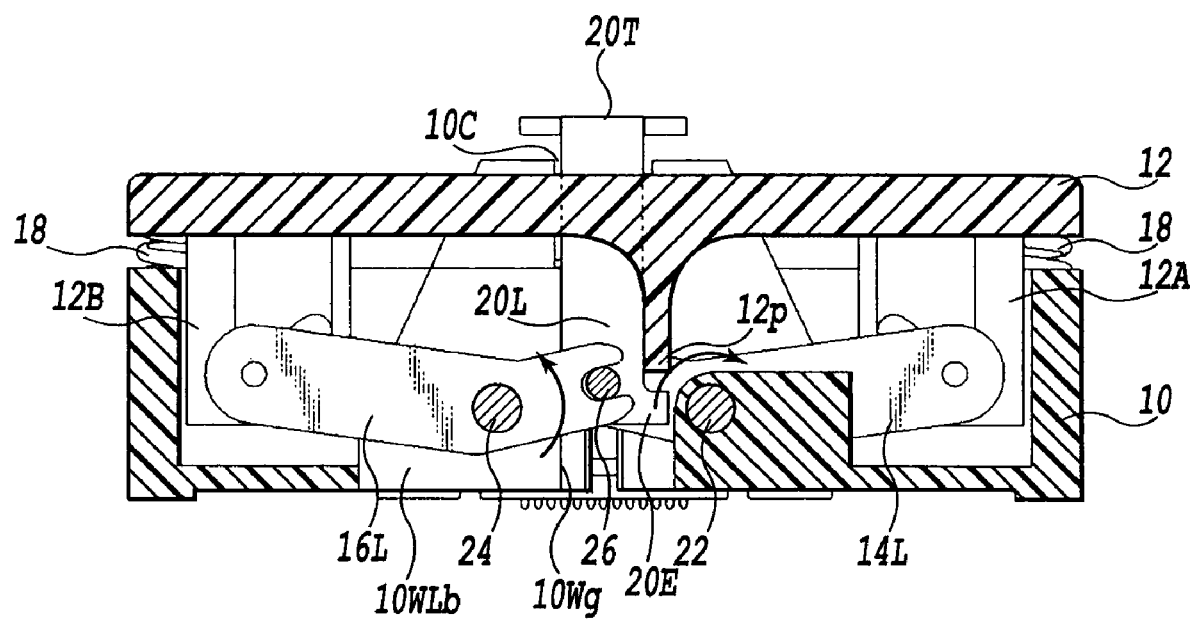
FIG. 6 is a front view in FIG. 5.

At a position adjacent to the respective slit 10S on the inner periphery of the socket body 10, an elongate groove 10D is formed generally parallel to the slit 10S, as shown in FIG. 2. In the groove 10D, a projected piece 12P of the cover member 12 described later is engaged to be movable when the cover member 12 is moved downward as illustrated in FIGS. 5 and 6.

In a generally central portion of the socket body 10, the module accommodation portion 10A for accommodating the contact pin module 31 is formed. On the peripheral edge of the module accommodation portion 10A, positioning projections 10m are formed at four positions, for guiding the semiconductor device DV to a predetermined position when the respective corners of the semiconductor device package to be mounted are engaged to the positioning projections 10m. There is a pair of opposed cutouts 10C between the positioning projections 10m, for allowing a pressing surface of the presser member 20 described later to pass therethrough.

Figure 4:
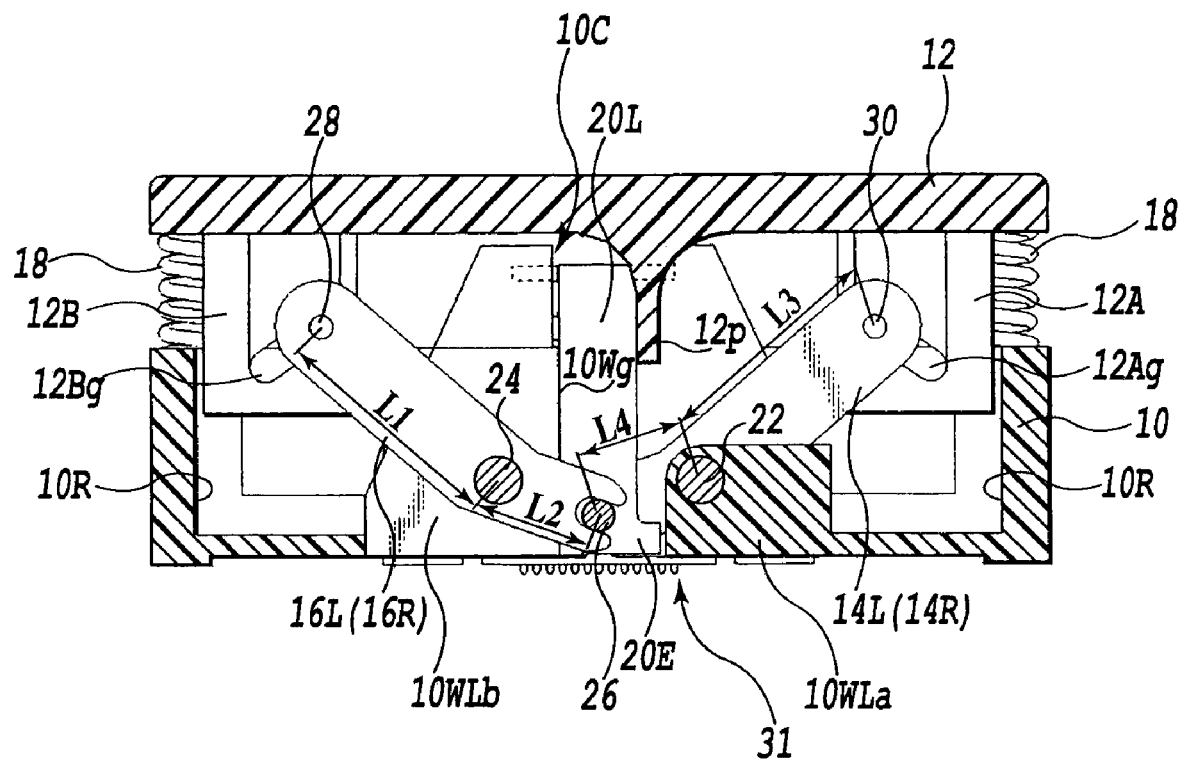
FIG. 4 is a front view in FIG. 1.

As shown in FIG. 4, opposed recesses 10R are formed on the circumference of the module accommodation portion 10A. Lower ends of arm members 12A and 12B are selectively inserted into the respective recesses 10R, as shown in FIG. 8.

Also, in a central area of the short side of a wall defining the respective recess 10R, as shown in FIGS. 2 and 3, spring-receiving portions are formed at two adjacent positions, each for receiving one end of the coil spring 18 as described later.

Figure 1:
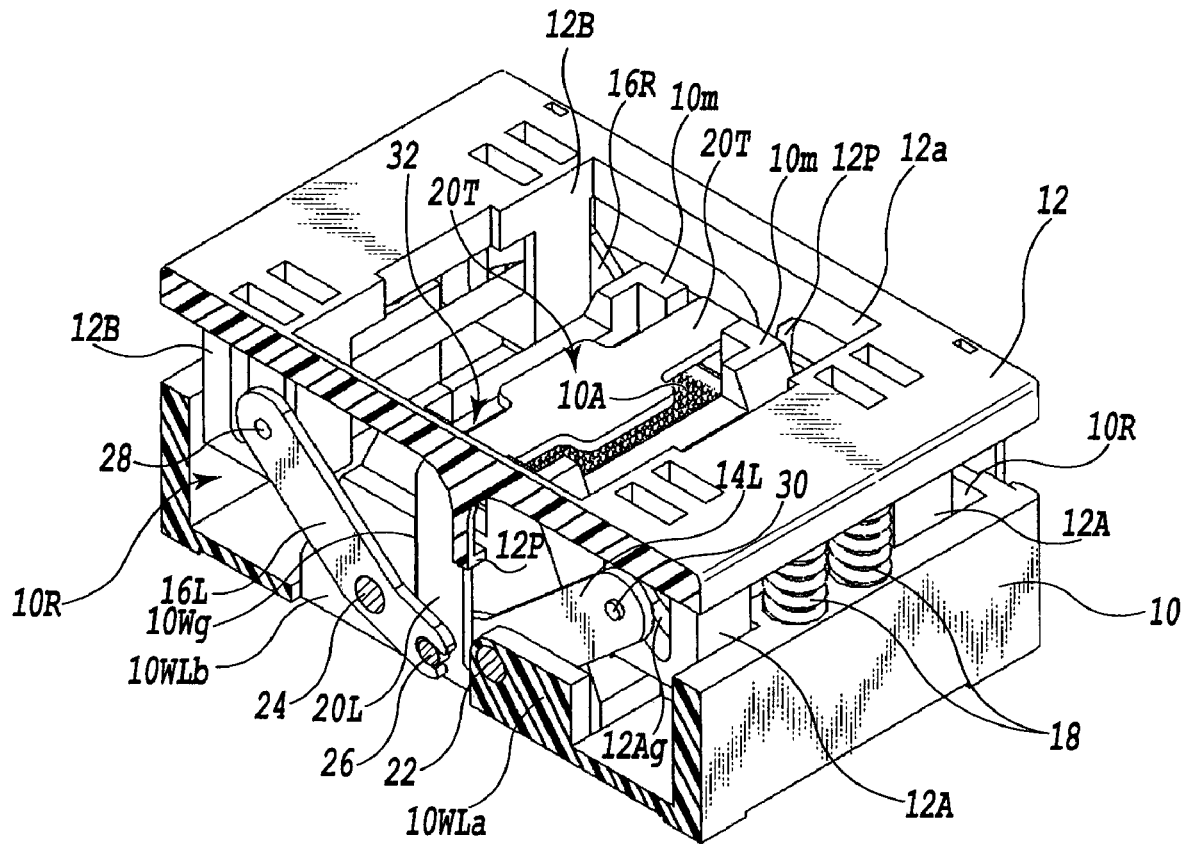
FIG. 1 is a perspective view including a partial cutaway view of a main portion of a first embodiment of a socket for a semiconductor device according to the present invention.

In a portion contiguous to the peripheral edge of the above-mentioned cutout 10C on the outer periphery of the module-accommodation portion 10A, as shown in FIGS. 1 and 4, link supports 10WLb and 10WRb defining, respectively, a guide wall surface 10Wg for restricting the rotative movement of a link member of the link mechanism and the presser member 20 described later are formed. The guide wall surface 10Wg is formed to be bulged from the outer periphery of the module-accommodation portion 10A to the inner periphery of the socket body 10.

Figure 8:
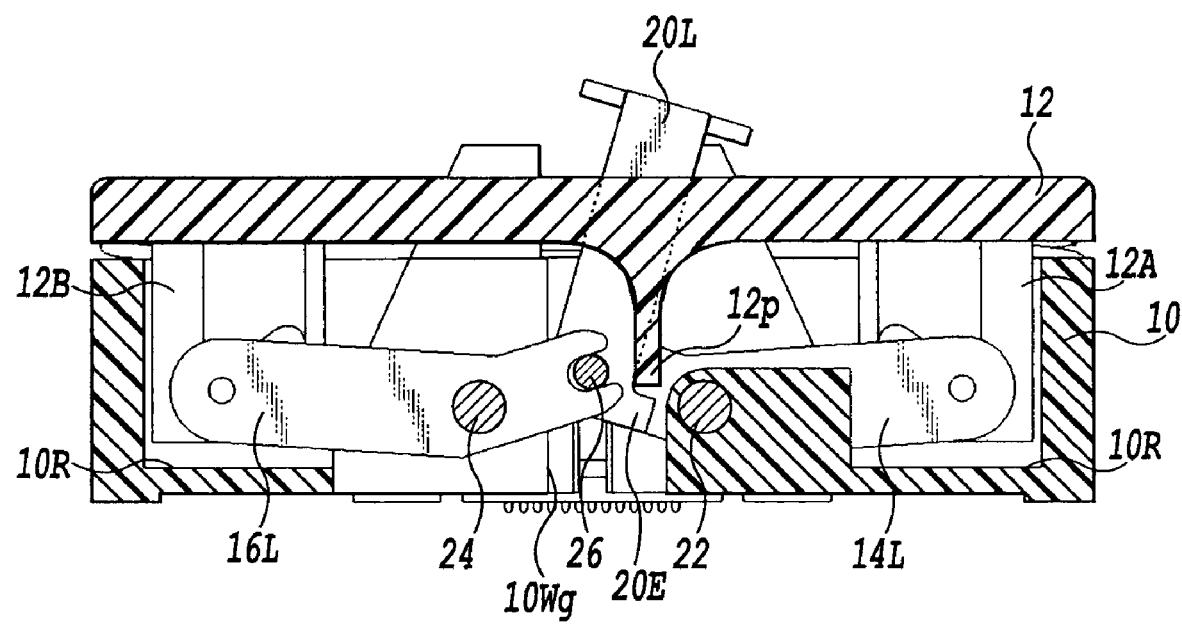
FIG. 8 is a front view of the embodiment in FIG. 7.

As shown in FIGS. 1 and 8, a side surface of leg 20L of the presser member 20 is selectively brought into contact with each of the pair of guide wall surfaces 10Wg or apart therefrom. Accordingly, if a side surface of the respective leg 20L of the presser member 20 is brought into contact with the guide wall surface 10Wg, the counterclockwise rotation of the leg 20L of the presser member 20 is restricted.

Note that, in FIGS. 1 and 4, one side of the link support 10WLb is solely illustrated and the other link support 10WRb is not shown. In this regard, the other link support 10WRb is formed opposite to the link support 10WLb across the contact pin module 31.

The alignment plate 32 has a flat plate portion on which is placed the semiconductor device DV. On the flat plate portion, relatively small recesses are formed lengthwise and crosswise in correspondence to the respective terminals of the semiconductor device DV. Such recesses communicate with through-holes in which the terminal portion of the contact pin module 31 is inserted. Thus, by these recesses, relative positions of the respective terminals of the semiconductor device DV are positioned relative to the flat plate portion, and relative positions of the respective terminals of the semiconductor device DV are positioned relative to the terminals of the contact pin module 31.

The alignment plate 32 is supported by a supporting mechanism not shown to be movable in a predetermined range in the direction to which the presser member 20 is pressed.

Figure 10:
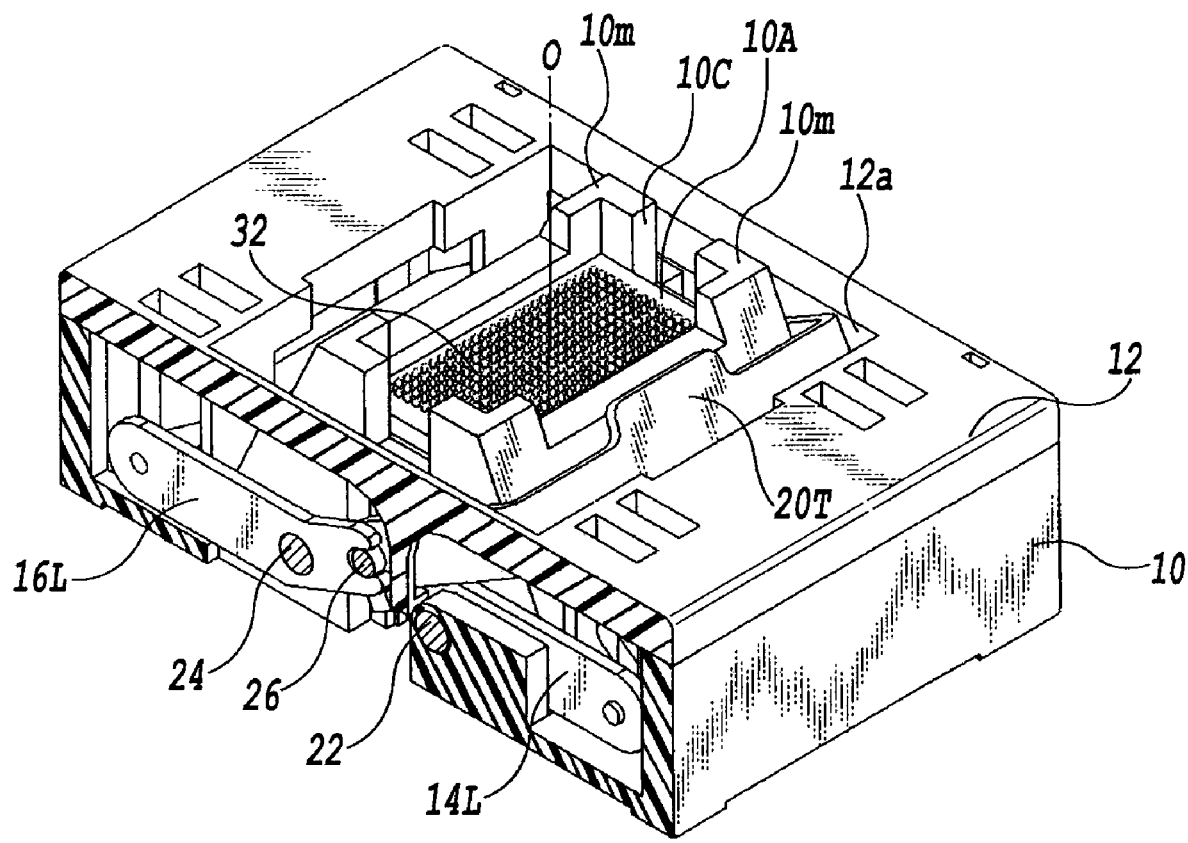
FIG. 10 is a perspective view made available for explaining the operation of the embodiment shown in FIG. 2.

As shown in FIGS. 2 and 10, the cover member 12 has an opening 12a in a central portion thereof, through which passes the upper end of the semiconductor device DV or the positioning projections 10m. On a surface of the cover member 12 opposed to the above-mentioned recess 10R of the socket body 10, pairs of arm members 12A and 12B are vertically projected, respectively.

The pair of arm members 12A are provided along a short side thereof while apart from each other at a predetermined distance. In a portion of the arm member 12A opposed to the guide nibs 12N of the cover member 12, guide grooves 12Ag for guiding a coupling pin 30 described later together with the link members 14L and 14R are formed. As enlarged in FIG. 4, the guide groove 12Ag on one side is formed as an elongate hole extending obliquely downward in the right direction. The guide groove 12Ag on the other side is formed as an elongate hole extending opposite to the former obliquely downward in the left direction.

The pair of arm members 12B are provided along a short side thereof while apart from each other at a predetermined distance. In a portion of the arm member 12B opposed to the guide nibs 12N of the cover member 12, guide grooves 12Bg for guiding a coupling pin 28 described later together with the link members 16L and 16R are formed. As enlarged in FIG. 4, the guide groove 12Bg on one side is formed as an elongate hole extending obliquely downward in the left direction. The guide groove 12Bg on the other side is formed as an elongate hole extending opposite to the former obliquely downward in the right direction.

At each ends of the respective long side of the cover member 12, the guide nibs 12N engageable with the guide grooves 10G of the socket body 10 are projected toward the socket body 10. Between the guide nibs 12N, the projected piece 12P projected downward is formed generally parallel to the guide nib 12N.

Between the pair of arm members 12A and between the pair of arm members 12B, two coil springs 18 for biasing the cover member 12 upward are provided between the lower surface of the cover member 12 and the spring-receiving portion of the socket body 10, respectively.

As disclosed in Japanese Patent Laid-Open No. 2002-202344, the contact pin module 31 is constituted by a pair of side plates forming opposite ends thereof, and a plurality lead frames laid in generally parallel to each other via spacers between the side plates, as main elements.

In this regard, in place of the contact pin module 31 disposed within the module accommodation portion 10A a plurality of contact pins, each having an upper pin terminal, a lower pin terminal and a spring within a sleeve, may be arranged in an insulated substrate, for example, as disclosed in Japanese Patent Laid-Open No. 8-213088 (1996).

In a predetermined gap formed between a part of the outer periphery of the above-mentioned module accommodation portion 10A wherein the cutout 10C is formed and the inner peripheral surface of the socket body 10, the link mechanism and the respective legs 20L of the presser member 20 are movably arranged.

The presser member 20 is made of, for example, a stamped thin steel sheet to have a gate form and the presser member 20 has a opposed pair of legs 20L and a pressing surface portion 20T coupling one ends of both the legs 20L to each other. The pressing surface portion 20T is formed to be generally parallel to the outer peripheral surface of the package of the semiconductor device DV disposed on the alignment plate 32 when it is located at a position directly above the alignment plate 32.

A mutual distance between the opposed pair of legs 20L located vertical to the pressing surface portion 20T is generally equal to the mutual distance between the pair of guide wall surfaces 10Wg formed on the outer periphery of the above-mentioned module accommodation portion 10A, while defining a predetermined gap to the other portion of the outer periphery of the module accommodation portion 10A.

At a lower end of the respective leg 20L, the coupling pin 26 is provided. A central axis of the coupling pin 26 is generally vertical to a center line O passing through a centroid of the above-mentioned module accommodation portion 10A opposed thereto (see FIG. 10).

Opposite ends of the coupling pin 26 are respectively engaged with branches provided at one ends of the link members 16L, 14L and 16R, 14R. A lower end of the respective leg 20L has a hook shape to form an engagement portion 20E to be selectively engageable with a lower end of the above-mentioned projected piece 12P of the cover member 12.

Thereby, the respective leg 20L is supported between the guide wall surface 10Wg of the link support 10WRb and the cover member 12P to be movable upward and downward. That is, the pressing surface portion 20T is movable in the direction generally vertical to the outer peripheral surface of the package of the semiconductor device DV.

Also, the respective leg 20L of the presser member 20 is rotatable about the coupling pin 26 as the center of rotation while keeping a predetermined gap to the outer periphery of the module accommodation portion 10A.

The link mechanism for moving the pressing surface portion 20T of the presser member 20 to a pressing position shown in FIG. 2 or a waiting position shown in FIG. 10 includes the link members 16L and 16R, one end of each being slidably supported by a guide groove 12Bg of the arm member 12B via the coupling pin 28, and the link members 14L and 14R, one end of each being slidably supported by a guide groove 12Ag of the arm member 12A via the coupling pin 30.

The link member 16L and 16R are opposed to each other across the arm member 12B. Also, the link member 14L and 14R are opposed to each other across the arm member 12A.

Since the link members 16L and 16R have the same structure, the explanation will be solely made on the link member 16L, and that of the link member 16R will be eliminated. Also, since the link members 14L and 14R have the same structure, the explanation will be solely made on the link member 14L, and that of the link member 14R will be eliminated.

A middle portion of the link member 16L is swayingly supported by a link support 10WLb via a supporting shaft 24. A distance L1 from a center of the supporting shaft 24 to one end of the link member 16L is set to be longer than a distance L2 from the center of the supporting shaft 24 to the other end of the link member 16L. Also, the other end of the link member 16L is inclined counterclockwise at a predetermined angle relative to a straight line in FIG. 4 connecting a center of the supporting shaft 24 to the one end of the link member 16L. At the other end of the link member 16L, there is a branch, to which is engaged one end of the coupling pin 26 of the presser member 20.

The link member 14L is disposed in the socket body 10 at a position more inside than the other end of the link member 16L and the leg 20L of the presser member 20. Similarly, the link member 14R is disposed in the socket body 10 at a position more inside than the other end of the link member 16R and the leg 20L of the presser member 20.

A middle portion of the link member 14L is swayingly supported by a link support 10WLa via a supporting shaft 22. A distance L3 from a center of the supporting shaft 22 to one end of the link member 14L is set to be longer than a distance L4 from the center of the supporting shaft 22 to the other end of the link member 14L. Also, the other end of the link member 14L is inclined clockwise at a predetermined angle relative to a straight line in FIG. 4 connecting a center of the supporting shaft 22 to the one end of the link member 14L. At the other end of the link member 14L, there is a branch, to which is engaged one end of the coupling pin 26 of the presser member 20.

Thereby, when the cover member 12 is moved downward against the biasing force of the coil spring 18, the branch provided at the other end of the link members 16R and 16L is rotated about the supporting shaft 24 in the direction as shown by an arrow in FIG. 6, and the branch provided at the other end of the link members 14R and 14L is rotated about the supporting shaft 22 in the direction as shown by an arrow in FIG. 6. Accordingly, the leg 20L of the presser member 20 is moved upward until the lower end of the projected piece 12P of the cover member 12 is brought into contact with the engagement portion 20E of the leg 20L in the presser member 20. At that time, since the above-mentioned distance L1 is determined to be longer than the distance L2 and the above-mentioned distance L3 is determined to be longer than the distance L4, a force for operating the cover member 12 becomes smaller than a pressure of the pressing surface portion 20T of the presser member 20, based on the principle of leverage.

Figure 7:
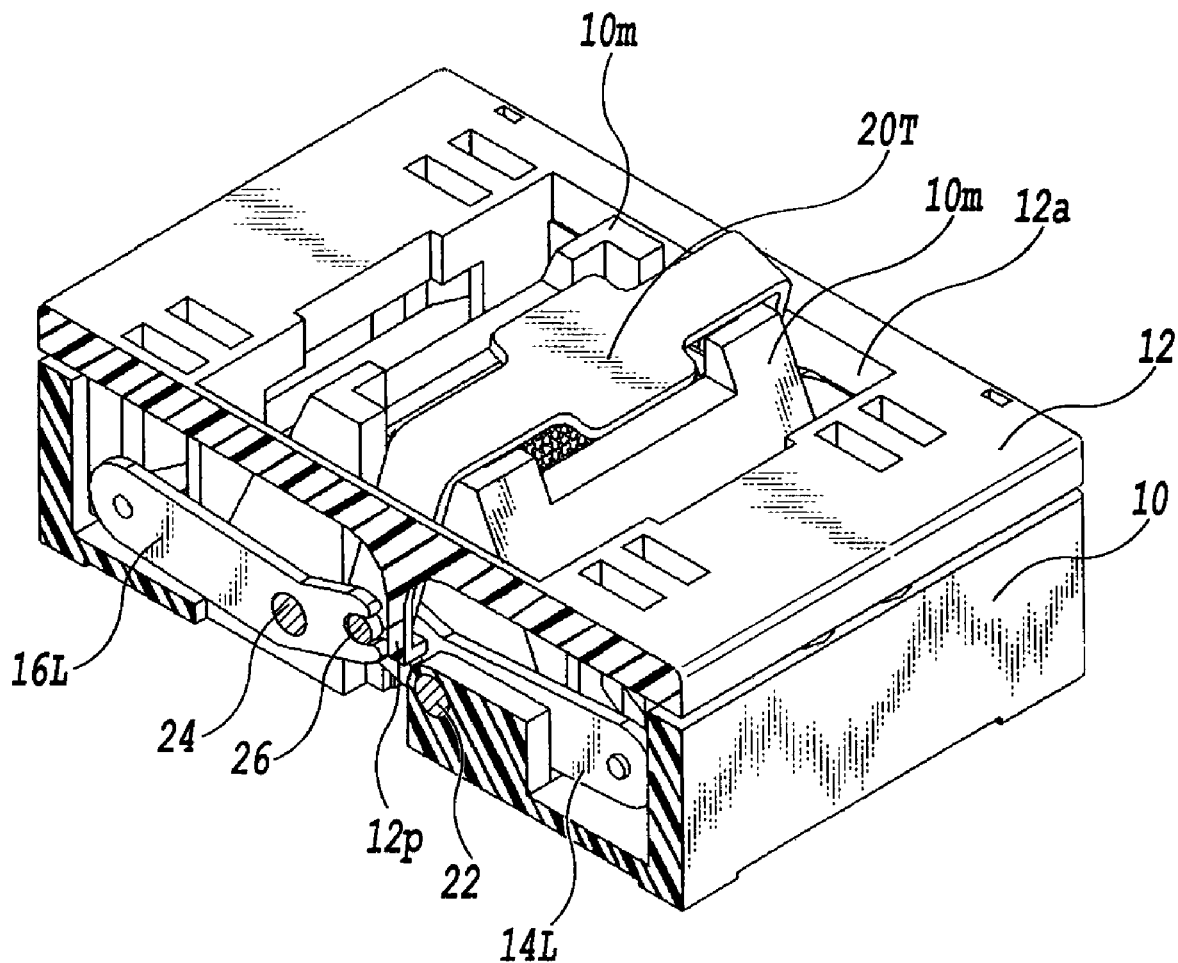
FIG. 7 is a perspective view made available for explaining the operation of the embodiment shown in FIG. 2.

When the cover member 12 is moved further downward, as shown in FIGS. 7 and 10, a lower end of the projected piece 12P of the cover member 12 is brought into contact with the engagement portion 20E of the leg 20L in the presser member 20. Thus, the lower end of the projected piece 12P is pushed down, and the leg 20L of the presser member 20 is rotated about the coupling pin 26 to a predetermined waiting position.

On the other hand, when the cover member 12 is moved upward from a state shown in FIG. 10 by the biasing force of the coil spring 18, the branches provided at the other ends of the link members 16R and 16L are rotated clockwise about the supporting shaft 24, while the branches provided at the other ends of the link members 14R and 14L are rotated counterclockwise about the supporting shaft 22. At that time, the lower end of the projected piece 12P is moved upward together with the leg 20L of the presser member 20 engaged therewith, whereby the leg 20L of the presser member 20 is rotated counterclockwise about the coupling pin 26 in FIG. 7. And, after the respective leg 20L of the presser member 20 is brought into contact with the pair of guide wall surfaces 10Wg, the respective legs 20L are pushed down by the branches provided at the other ends of the link members 16R, 16L and the link members 14R, 14L.

In such a structure, when the test of the semiconductor device DV is carried out, the cover member 12 is pushed downward, for example, by a front end of an arm of a working robot not shown from the uppermost end position shown in FIG. 1 against the biasing force of the coil spring 18 as illustrated in FIG. 5.

Thereby, as shown in FIGS. 5 and 6, the branches provided at the other ends of the link members 16R, 16L and 14R, 14L are moved upward whereby the legs 20L of the presser member 20 are moved upward by a predetermined distance while sliding on the guide wall surface 10Wg.

Figure 9:
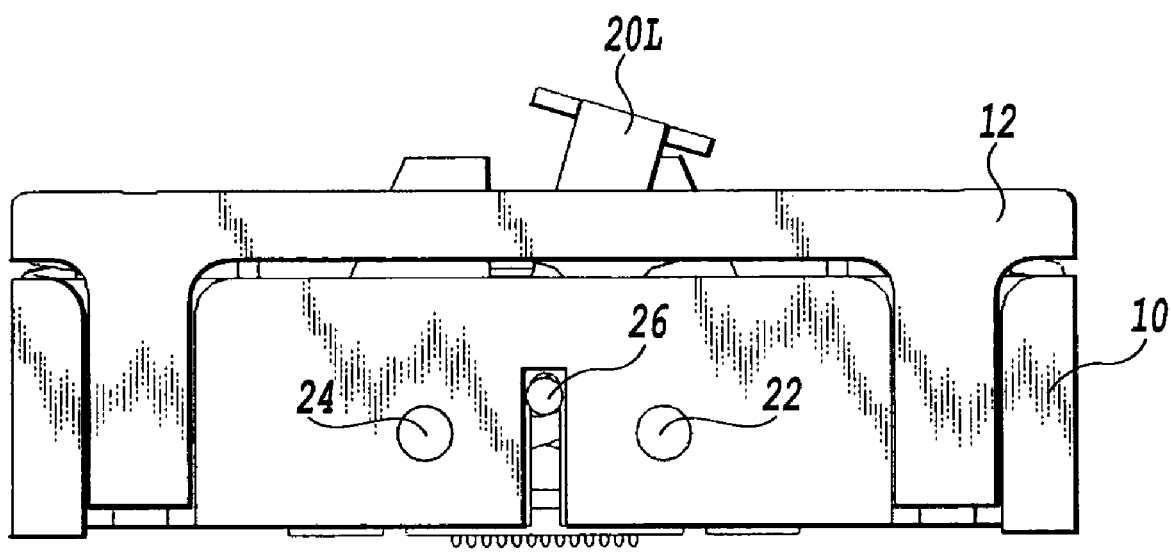
FIG. 9 is a front view illustrating an appearance of a state shown in FIG. 7.

Then, when the cover member 12 is further pressed as shown in FIGS. 7 to 9, the projected piece 12P of the cover member 12 is pressed while being in contact with the engagement portion 20E of the leg 20L, whereby the leg 20L of the presser member 20 is rotated about the coupling pin 26, and the pressing surface portion 20T is rotated to be away from a position directly above the alignment plate 32. Thereby, the upper end of the side surface of the leg 20L in the presser member 20 begins to separate from the guide wall surface 10Wg.

Figure 11:
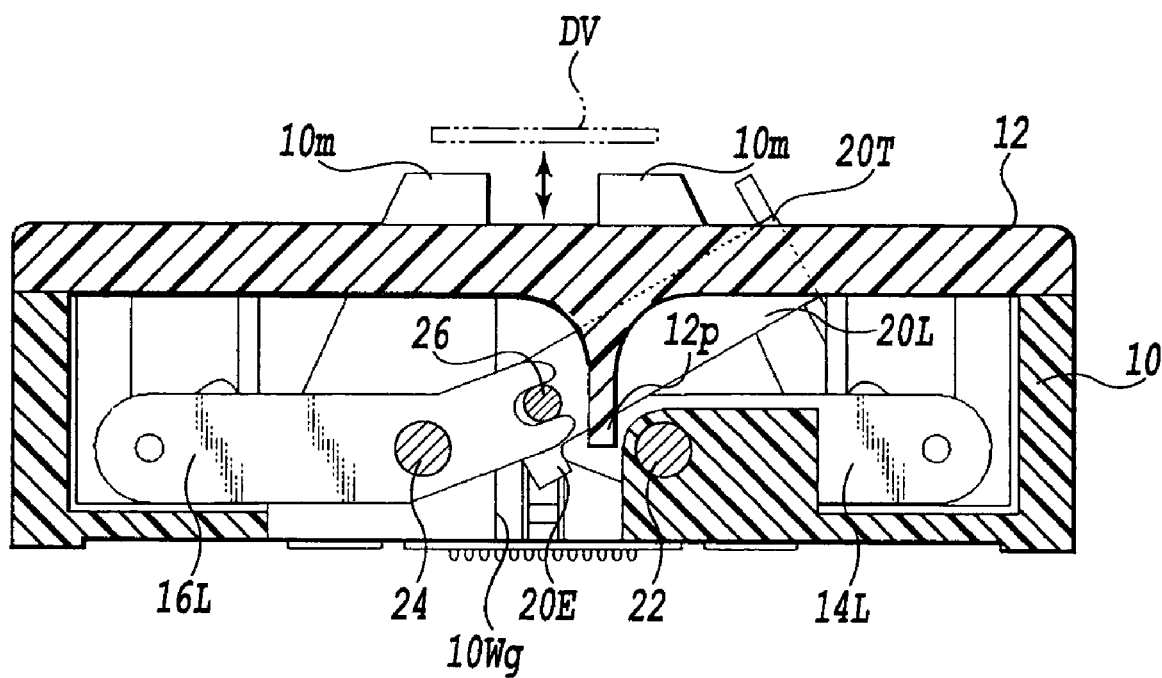
FIG. 11 is a front view in FIG. 10.
Figure 12:
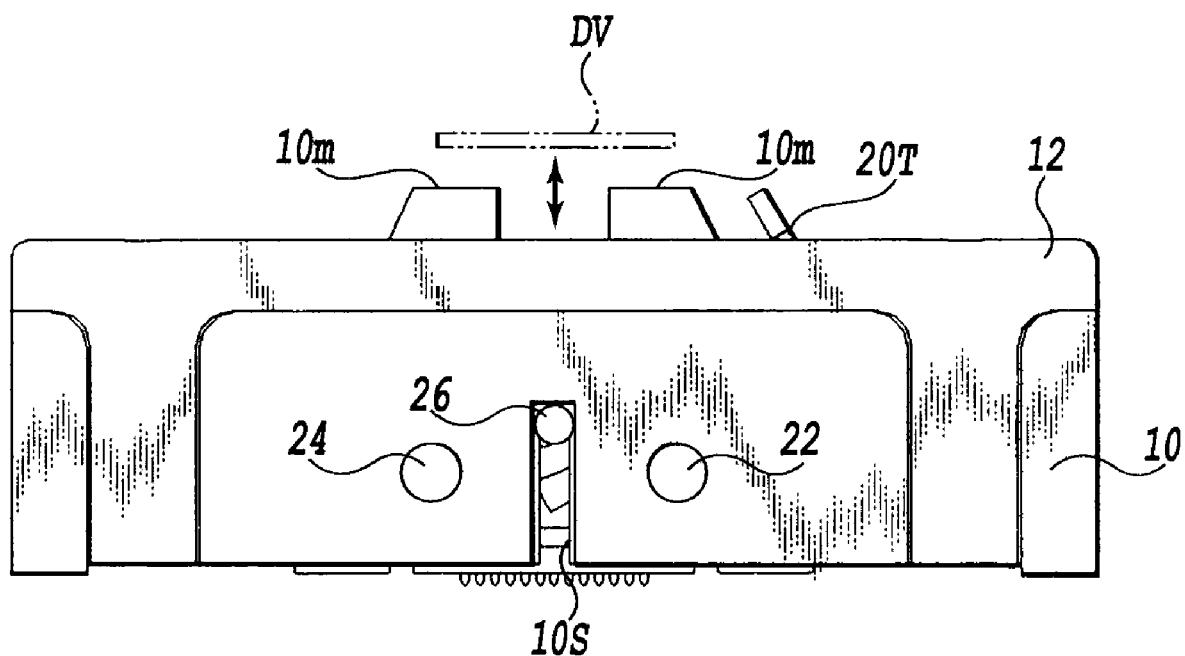
FIG. 12 is a front view illustrating an appearance of a state shown in FIG. 10.

Subsequently, as shown in FIGS. 10 to 12, when the cover member 12 is held after the cover member 12 has been further pressed down to the lowermost end position, the rotated leg 20L of the presser member 20 is engaged with a front end of the projected piece 12P of the cover member 12, and also, the pressing surface portion 20T of the presser member 20 is located at a predetermined waiting position defined around the module accommodation portion 10A.

Also, the semiconductor device DV is sucked and held by a conveyor arm of the conveyor robot not shown and transported to a position directly above the opening 12a of the cover member 12 and the alignment plate 32.

Subsequently, the semiconductor device DV sucked and held by the conveyor arm is located on a flat portion of the alignment plate 32 and mounted thereto.

Subsequently, the cover member 12 is moved upward while a front end of the working robot is in contact with the upper surface of the cover member 12 to the uppermost end position due to the biasing force of the coil spring 18. Thereby, the projected piece 12P of the cover member 12 rotates the leg 20L toward the guide wall surface 10Wg, and the pressing surface portion 20T of the presser member 20 returns to a state illustrated in FIG. 5. Thereafter, as shown in FIG. 1, the pressing surface portion 20T is moved downward through the cutout 10C and brought into contact with the outer peripheral surface of the package of the semiconductor device DV without grinding at a predetermined pressure. Thereby, the pressing surface portion 20T presses the semiconductor device DV toward the contact pin module 31. Accordingly, there is no risk in that the package of the semiconductor device DV is damaged by the pressing surface portion 20T of the presser member 20.

When the test signal is supplied to the input/output portion of the printed wiring board PB while keeping the cover member 12 at the test position, the test signal is supplied to the semiconductor device DV via the contact pin module 31. If the abnormality is detected in a circuit thereof, the abnormality detection signal issued from the semiconductor device DV is supplied to the external fault diagnosis device.

When the test of the semiconductor device has completed, the front end of the arm in the working robot is pressed downward against the biasing force of the coil spring 18 while being in contact with the upper surface of the cover member 12 in the same manner as described before so that the semiconductor device DV thus tested is taken out and a new one is mounted. The semiconductor device DV thus tested is removed from the alignment plate 32 by the conveyor arm, and the new semiconductor device DV to be tested is mounted in the same manner as described before.

Figure 13:
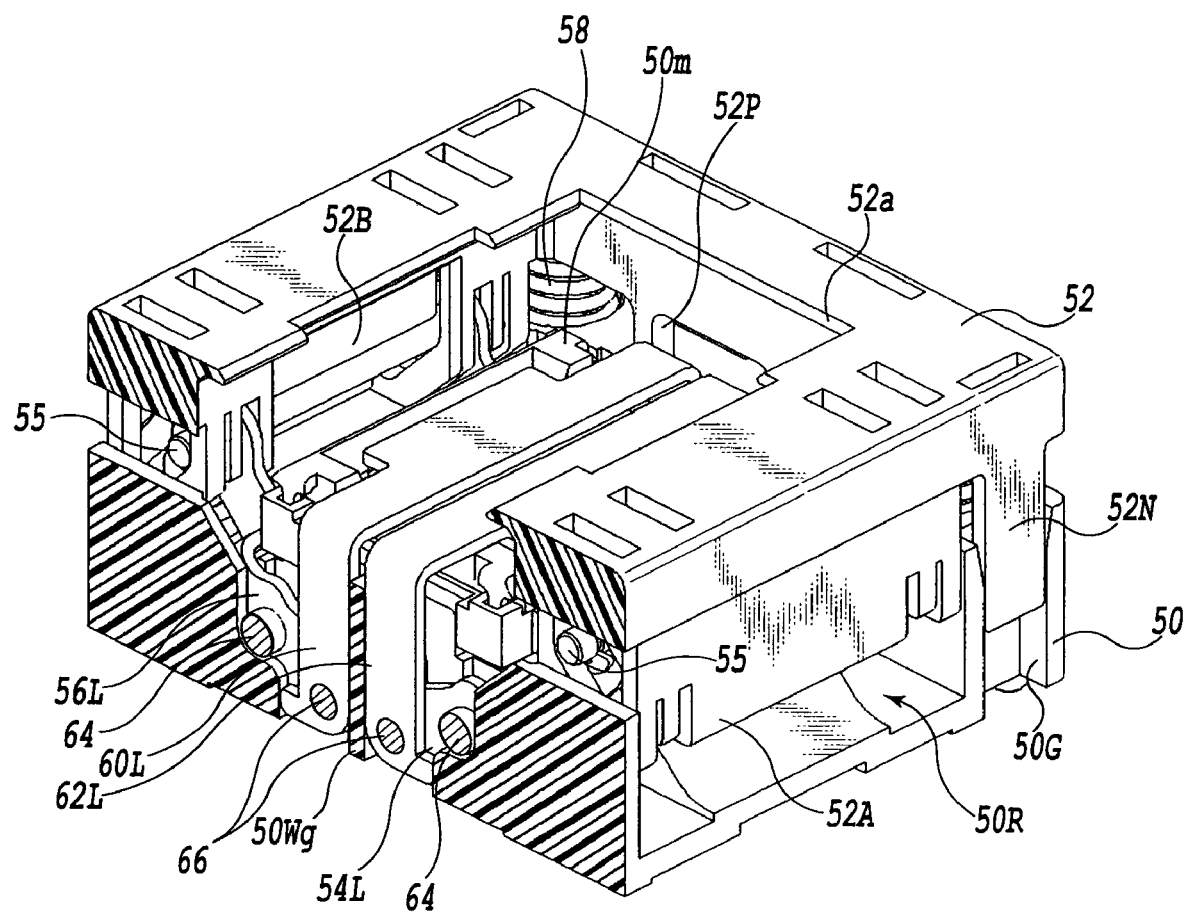
FIG. 13 is a perspective view including a partial cutaway view of a main portion of a second embodiment of a socket for a semiconductor device according to the present invention.

FIG. 13 illustrates a main part of a second embodiment of a socket for a semiconductor device according to the present invention.

In the embodiment illustrated in FIG. 1, a single presser member 20 is provided for one semiconductor device to be mounted. Contrarily thereto, in the embodiment shown in FIG. 13, a pair of presser members 60 and 62 are provided for one semiconductor device to be mounted.

In FIGS. 13 to 17A and 17B, the same reference numerals are used for denoting the same elements as in the embodiment illustrated in FIG. 1, and the redundant explanation thereof will be eliminated.

In the embodiment shown in FIG. 13, kinds of the semiconductor device as an object to be tested are the same as the above-mentioned semiconductor device DV. However, a size of the semiconductor device to be tested is larger than that of the former semiconductor device DV.

The socket for the semiconductor device is disposed on a printed wiring board PB (see FIG. 17A) in the same manner as in the above-mentioned embodiment.

In FIG. 13, the socket for the semiconductor device includes, as main elements, contact pin module 48 for electrically connecting the respective electrode pads (terminal portions) on the printed wiring board PB with terminals of a semiconductor device DV, a socket body 50 having a module accommodation portion 50A for accommodating the contact pin module 48, an alignment plate 51 as a positioning member for locating the respective electrodes of the semiconductor device DV to the respective terminal portions of the contact pin module 48, supported to be movable up and down on an upper portion of the contact pin module 48, a cover member 52 disposed on the socket body 50 to be movable up and down so that a presser members 60 and 62 described later selectively come closer to or away from the alignment plate 51 while rotating, presser members 60 and 62 for pressing the respective terminals of the semiconductor device DV via the alignment plate 51 in accordance with the upward motion of the cover member 52 toward the contact pins of the contact pin module 48 to hold or release the same, and a link mechanism for operating the presser members 60 and 62 in association with the up/down motion of the cover member 52.

On the outer periphery of the respective side in the socket body 50, guide grooves 50G engaged with the respective guide nibs 52N described later of the cover member are formed at a predetermined interval to be movable up and down. The guide groove 50G is formed generally perpendicular to the bottom surface of the socket body 50. At one end of the respective groove 50G, a front end of the guide nib 52N is locked when the cover member 52 is at the uppermost end position as shown in FIG. 13.

Figure 15:
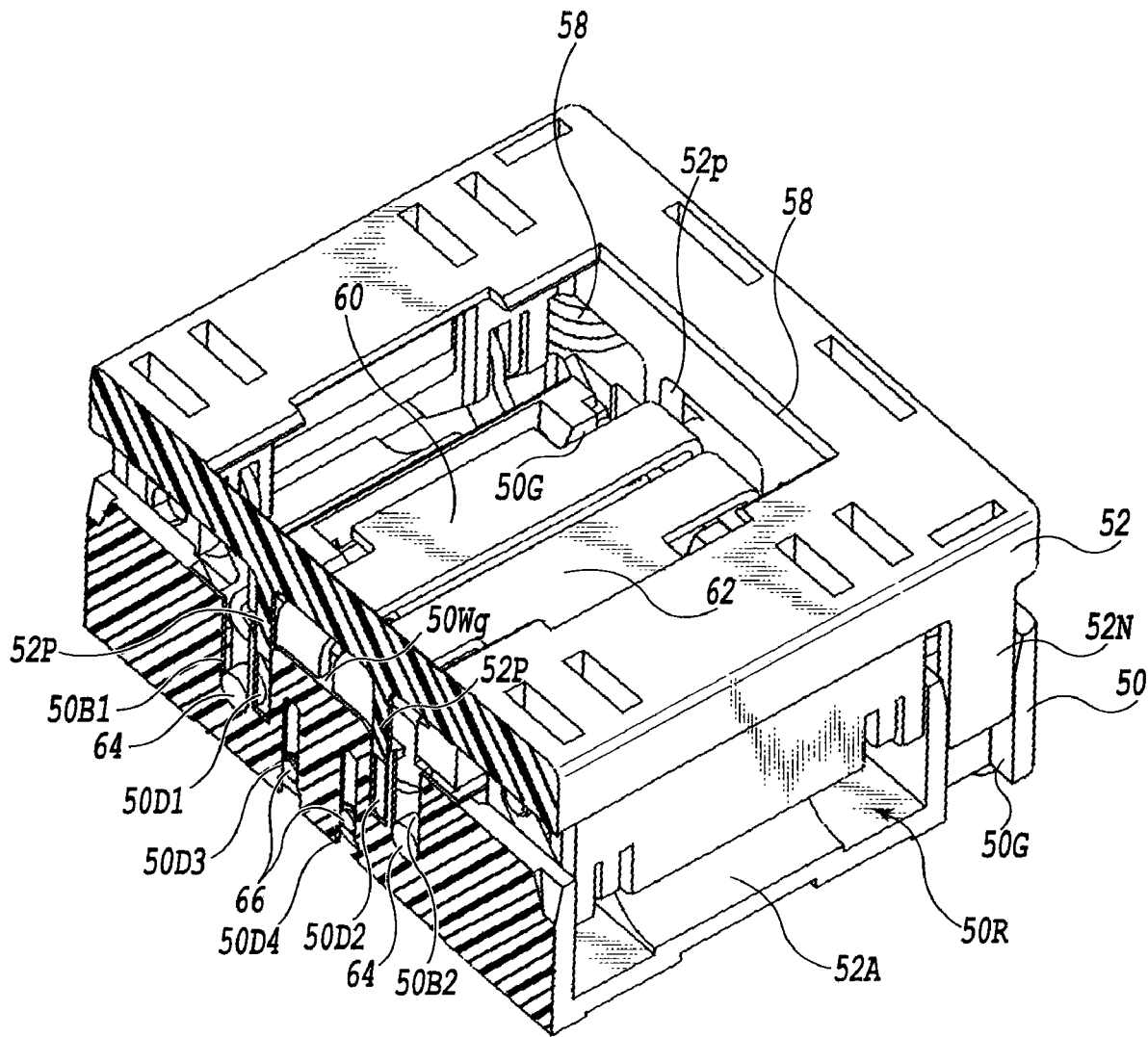
FIG. 15 is a perspective view illustrating a main portion of the embodiment shown in FIG. 13 together with a partial sectional view thereof.

At positions opposed to the respective legs 60L, 62L of the presser members 60 and 62 described later on the inner periphery of the socket body 50, elongate grooves 50D3 and 50D4 for guiding ends of the respective coupling pins 66 are formed generally parallel to each other, as shown in FIG. 15. Also, on both sides of the grooves 50D3 and 50D4, grooves 50B1 and 50B2 for receiving one ends of the respective supporting shafts 64 described later are formed generally parallel to the grooves 50D3 and 50D4. Further, between the grooves 50B1 and 50D3, and between the grooves 50B2 and 50D4, grooves 50D1 and 50D2 are respectively formed. In the grooves 50D1 and 50D2, projected pieces 52P of the cover member 52 described later are engaged to be movable when the cover member 52 is moved downward as illustrated in FIG. 15.

In a generally central portion of the socket body 50, the module accommodation portion 50A for accommodating the contact pin module 48 is formed. On the peripheral edge of the module accommodation portion 50A, positioning projections 50m are formed at four positions, engageable with the respective corners of the outer periphery of the package of the mounted semiconductor device. There is a pair of opposed cutouts 50C between the positioning projections 50m, for allowing pressing pieces of the presser members 60 and 62 described later to pass therethrough.

Figure 16:
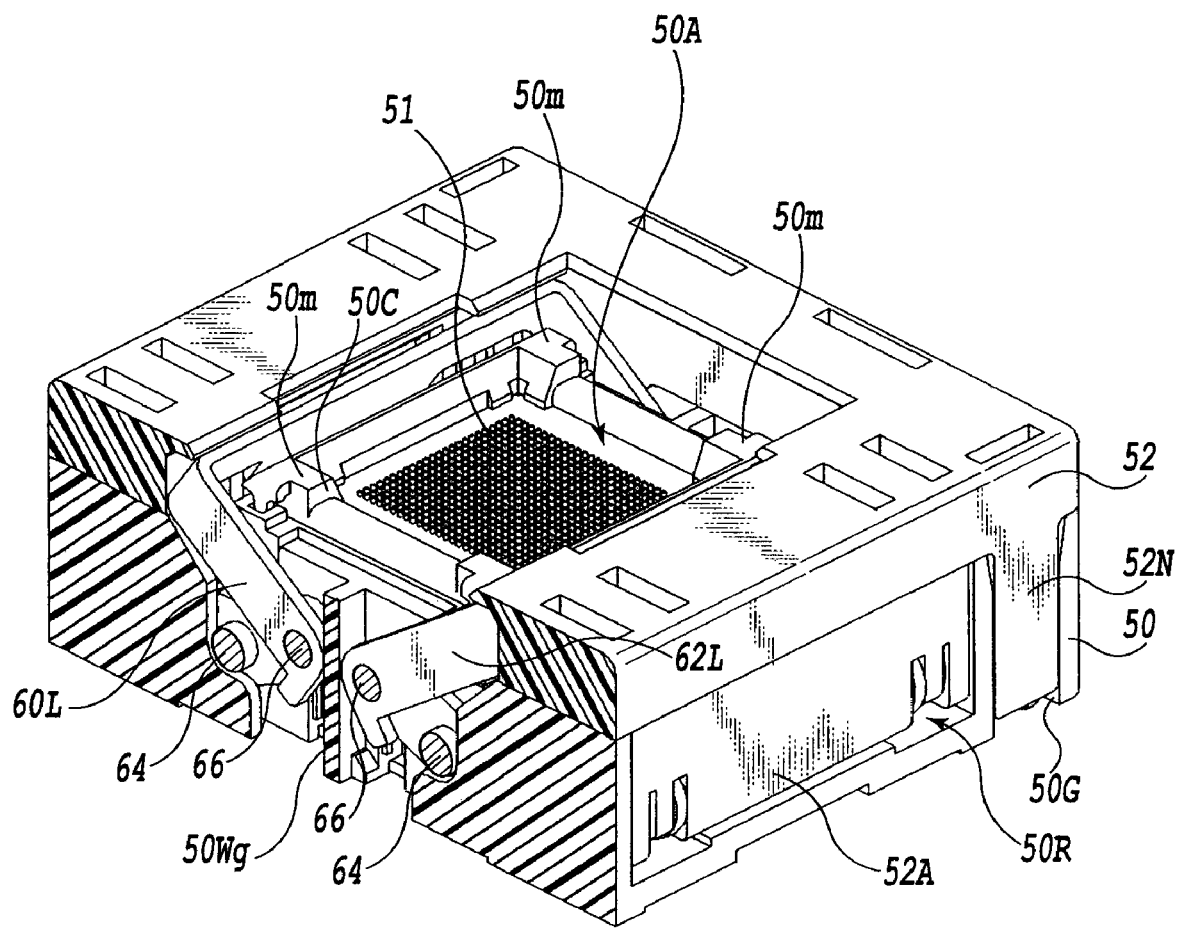
FIG. 16 is a perspective view made available for explaining the operation of the embodiment shown in FIG. 13.

Opposed recesses 50R are formed on the circumference of the module accommodation portion 50A. As shown in FIG. 16, in the respective recess 50R, lower ends of arm members 52A and 52B are selectively inserted into the respective recesses 50R, as shown in FIG. 16.

Also, on both sides of a wall portion forming the respective recess 50R, as shown in FIG. 16, spring-receiving portions are formed adjacent to each other, each for receiving one end of the coil spring 58 as described later.

In a portion contiguous to the peripheral edge of the above-mentioned cutout 50C on the outer periphery of the module-accommodation portion 50A, as shown in FIG. 16, a guide wall portion 50Wg forming a guide wall surface for restricting the rotation of part of the link mechanism described late are formed. The guide wall portion 50Wg is formed to be bulged from the outer periphery of the module-accommodation portion 50A to the inner periphery of the socket body 50.

At a pair of guide wall surfaces in the respective guide wall portion 50Wg, a side surface of leg 60L of the presser member 60 and a side surface of leg 62L of the presser member 62 is selectively brought into contact or apart therefrom.

Note that, in FIGS. 13 and 16, one side guide wall portion 50Wg is solely illustrated and the other side guide wall portion 50Wg is not shown. In this regard, the pair of guide wall portions 50Wg are formed opposite to each other across the contact pin module 48.

The alignment plate 51 has a flat plate portion on which is placed the semiconductor device. On the flat plate portion, relatively small recesses are formed in a matrix manner in correspondence to the respective terminals of the semiconductor device. Such recesses communicate with through-holes in which the terminal portion of the contact pin module 48 is inserted. Thus, by these recesses, positions of the respective terminals of the semiconductor device DV are defined relative to the flat plate portion, and relative positions of the respective terminals of the semiconductor device are positioned relative to the terminals of the contact pin module 48.

The alignment plate 51 is supported by a supporting mechanism not shown to be movable in a predetermined range in the direction to which the presser members 60 and 62 are pressed.

As shown in FIG. 13, the cover member 52 has an opening 52a in a central portion thereof, through which passes the upper end of the semiconductor device or the positioning projections 50m. On a surface of the cover member 52 opposed to the above-mentioned recess 50R of the socket body 50, pairs of arm members 52A and 52B are vertically projected.

The pair of arm members 52A and 52B are provided opposite to each other along a side thereof. In a portion of the arm member 52A opposed to the coil spring 58, guide grooves (not shown) for guiding a coupling pin 55 described later together with the link members 54L and 54R are formed.

In a portion of the arm member 52B opposed to the coil spring 58, guide grooves (not shown) are formed, for guiding the coupling pin 55 together with the link members 56L and 56.

At each ends of the respective side of the cover member 52, the guide nibs 52N engageable with the guide grooves 50G of the socket body 50 are projected toward the socket body 50. Also, a portion of the cover member 52 opposed to the link members 54L and 54R, the projected piece 52P projected downward is formed generally parallel to the guide nib 52N.

On both sides of a pair of arm members 12A and 12B, two coil springs 58 for biasing the cover member 52 upward are provided between the lower surface of the cover member 52 and the spring-receiving portion of the socket body 50.

The contact pin module 48 has the same structure as the above-mentioned contact pin module 31.

In this regard, in place of the contact pin module 48 a plurality of contact pins, each having an upper pin terminal, a lower pin terminal and a spring within a sleeve, may be arranged in an insulated substrate, for example, as disclosed in Japanese Patent Laid-Open No. 8-213088 (1996).

In a predetermined gap formed between a part of the outer periphery of the above-mentioned module accommodation portion 50A wherein the cutout 50C is formed and the inner peripheral surface of the socket body 50, the link mechanism and the respective legs 60L of the presser member 60 and the respective legs 62L of the presser member 62 are movably arranged.

Figure 14:
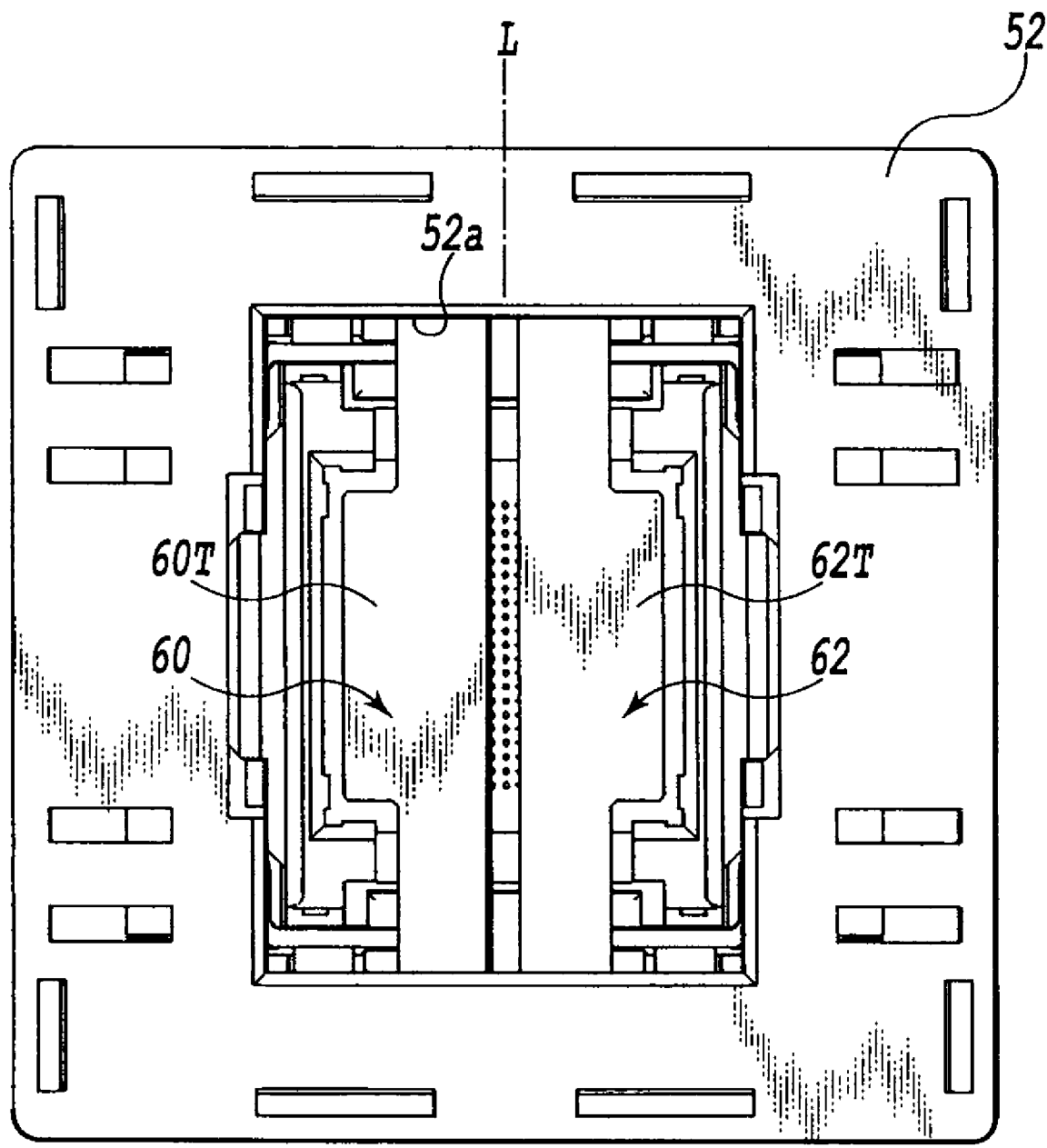
FIG. 14 is a top view of the embodiment shown in FIG. 13.

Since the presser members 60 and 62 have the same structure and arranged in symmetry to each other relative to a symmetry plane containing a center line passing through a centroid of FIG. 14, the explanation will be done solely on the presser member 60 and that of the presser member 62 will be eliminated.

The presser member 60 is made of, for example, a stamped thin steel sheet to have a gate form so that a opposed pair of legs 60L and a pressing surface portion 60T coupling one ends of both the legs 60L to each other. A mutual distance between the pair of legs 60L is generally equal to a mutual distance between a pair of guide wall portions 50Wg formed on the outer periphery of the above-mentioned module accommodation portion 50A, and determined to form a predetermined gap relative to other part of the outer periphery of the module accommodation portion 50A.

At a lower end of the respective leg 60L, the coupling pin 66 is provided. One end of the coupling pin 66 is engaged with a branch provided at one end of the link member 56L or 56R described later.

Since a position of the respective coupling pin 66 is deviated from a generally middle position of the socket body 50 to be apart from the other coupling pin, while the coupling pin 26 in the above-mentioned first embodiment is at a generally middle position of the socket body 10, a total length and a rotational angle of the presser members 60 and 62 become smaller to miniaturize a size of the socket body 50.

A lower end of the respective leg 60L has a hook shape to form an engagement portion 60E to be selectively engageable with a lower end of the above-mentioned projected piece 52P of the cover member 52.

Figure 17A:
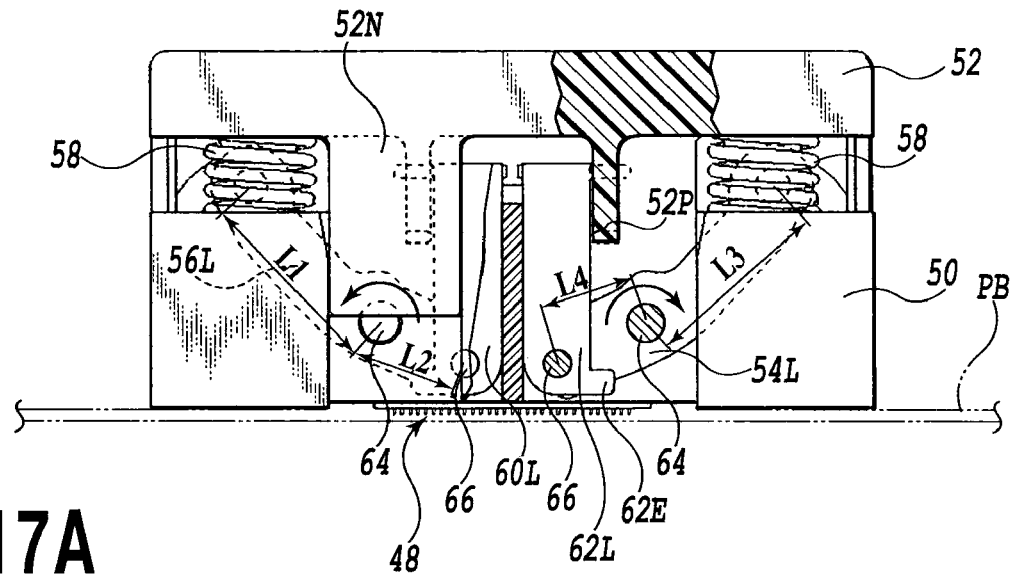
FIGS. 17A and 17B are front views, respectively, of the embodiment shown in FIG. 13.

Thereby, as shown in FIG. 17A, the respective leg 60L is supported between a wall surface of the guide wall 50Wg and the projected piece 52P of the cover member 52 to be movable upward and downward. Also, the respective leg 60L of the presser member 60 is rotatable about the coupling pin 66 at a predetermined gap from the outer periphery of the module accommodation portion 50A.

The link mechanism for displacing the pressing surface portion 60T of the presser member 60 to a pressing position shown in FIG. 13 or a waiting position shown in FIG. 16 includes the link members 56L and 56R, one end of each being slidably supported by a guide groove of the arm member 52B via the coupling pin 55, and the link members 54L and 54R, one end of each being slidably supported by a guide groove of the arm member 52A via the coupling pin 55.

The link member 56L and 56R are opposed to each other with the intervention of the arm member 52B therebetween. Also, the link member 54L and 54R are opposed to each other with the intervention of the arm member 52A therebetween.

Since the link members 56L and 56R have the same structure, the explanation will be solely made on the link member 56L, and that of the link member 56R will be eliminated. Also, since the link members 54L and 54R have the same structure, the explanation will be solely made on the link member 54L, and that of the link member 54R will be eliminated.

A middle portion of the link member 56L is swayingly supported via a supporting shaft 64. A distance L1 from a center of the shaft 64 to one end of the link member 56L is set to be longer than a distance L2 from the center of the shaft 64 to the other end of the link member 56L. Also, the other end of the link member 56L is inclined counterclockwise at a predetermined angle relative to a straight line in FIG. 4 connecting a center of the shaft 64 to the one end of the link member 56L. At the other end of the link member 56L, there is a branch, to which is engaged one end of the coupling pin 66 of the presser member 60.

The link member 54L is disposed inside of the socket body 50 in a plane common to the link member 56L in symmetry with the latter while using the center line L as a centroid in FIG. 14. Similarly, the link member 54R is disposed inside of the socket body 50 in the same manner as described above relative to the link member 56R.

As shown in FIG. 17A, a middle portion of the link member 54L is swayingly supported via a shaft 64. A distance L3 from a center of the shaft 64 to one end of the link member 54L is set to be longer than a distance L4 from the center of the shaft 64 to the other end of the link member 54L. Also, the other end of the link member 54L is inclined clockwise at a predetermined angle relative to a straight line in FIG. 17A connecting a center of the shaft 64 to the one end of the link member 54L. At the other end of the link member 54L, there is a branch, to which is engaged one end of the coupling pin 66 of the presser member 62.

Thereby, when the cover member 52 is moved downward against the bias of the coil spring 58, the branch at the other end of the link members 56R and 56L is rotated about the shaft 64 in the direction as shown by an arrow in FIG. 17A, and the branch at the other end of the link members 54R and 54L is rotated about the shaft 64 in the direction as shown by an arrow in FIG. 17A. Accordingly, the leg 60L of the presser member 60 and the leg 62L of the presser member 62 are moved upward generally parallel to each other until the lower end of the respective projected piece 52P of the cover member 52 is brought into contact with the engagement portion 60E of the leg 60L in the presser member 60 and the engagement portion 62E of the 62L in the presser member 60.

When the cover member 52 is moved further downward, a lower end of the projected piece 52P of the cover member 52 is brought into contact with the engagement portion 60E of the leg 60L in the presser member 60 and the engagement portion 62E of the leg 62L in the presser member 62. Thus, the lower end of the projected piece 52P is pushed down, and the leg 60L of the presser member 60 and the leg 62L of the presser member 62 are rotated about the coupling pin 66 to a predetermined waiting position to be away from each other. Note that the pressing surface portion 60T of the presser member 60 and the pressing surface portion 62T of the presser member 62 are rotated to a predetermined waiting position before the cover member 52 has reached the lowermost end position.

Figure 17B:
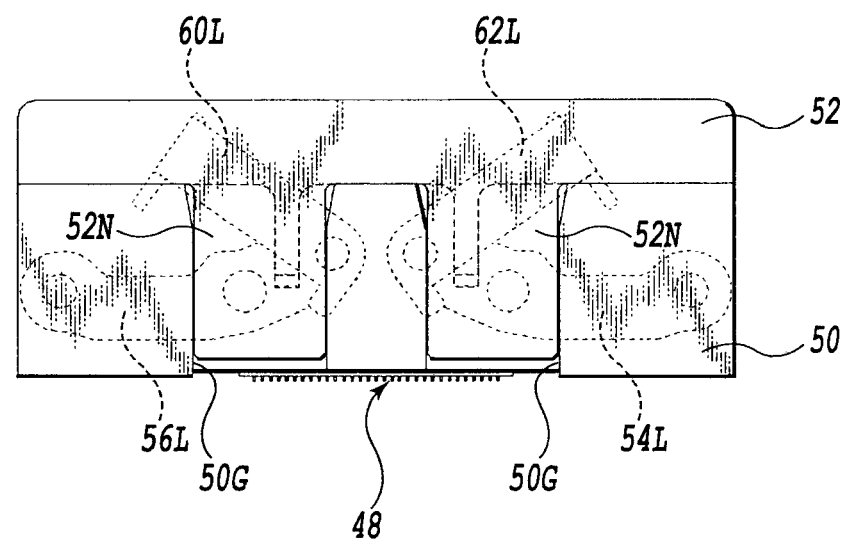

On the other hand, when the cover member 52 is moved upward from a state shown in FIG. 17B by the biasing force of the coil spring 58, the branches provided at the other ends of the link members 56R and 56L are rotated clockwise about the shaft 64, while the branches provided at the other ends of the link members 54R and 54L are rotated counterclockwise about the shaft 64. At that time, the lower end of the respective projected piece 52P is moved upward together with the leg 60L of the presser member 60 and the leg 62L of the presser member 62 engaged therewith, whereby the leg 60L of the presser member 60 and the leg 62L of the presser member 62 are rotated clockwise and counterclockwise about the coupling pin 66 to come closer each other in FIG. 17B.

After the leg 60L of the presser member 60 and the leg 62L of the presser member 62 are brought into contact with the guide wall portion 50Wg opposed thereto, the respective legs 60L and 62L are pushed downward by the branches provided at the other ends of the link members 56R and 56L and the link members 54R and 54L.

In such a structure, when the test of the semiconductor device DV is carried out, the cover member 52 is pushed downward in the same manner as in the above-mentioned first embodiment, for example, by a front end of an arm of a working robot not shown from the uppermost end position shown in FIG. 13 against the biasing force of the coil spring 58 as illustrated in FIG. 13.

Thereby, the leg 60L of the presser member 60 and the leg 62L of the presser member 62 are moved upward at a predetermined distance while sliding on the guide wall surface of the guide wall portion.

Then, when the cover member 52 is further pushed, the respective projected piece 52P of the cover member 52 is pushed while being in contact with the engagement portion 60E of the leg 60L and the engagement portion 62E of the leg 62L, whereby the leg 60L of the presser member 60 and the leg 62L of the presser member 62 are rotated about the coupling pin 66, and the pressing surface portions 60T and 62T are rotated to be away from a position directly above the alignment plate 51. Thereby, the upper end of the side surface of the leg 60L in the presser member 60 and the upper end of the side surface of the leg 62L in the presser member 62 begin to separate from the guide wall surface described before.

Subsequently, when the cover member 52 is held after the cover member 52 has been further pushed down to the lowermost end position, the rotated leg 60L of the presser member 60 and the that 62L of the presser member 62 are engaged with front ends of the respective projected pieces 52P, and also, the pressing surface portion 60T of the presser member 60 and the pressing surface portion 62T of the presser member 62 are located at a predetermined waiting position defined around the module accommodation portion 50A.

Also, the semiconductor device DV is sucked and held by a conveyor arm of the conveyor robot not shown and transported to a position directly above the opening 52a of the cover member 52 and the alignment plate 51.

Subsequently, the semiconductor device DV sucked and held by the conveyor arm is located on a flat portion of the alignment plate 51 and mounted thereto.

Subsequently, the cover member 52 is moved upward while a front end of the working robot is in contact with the upper surface of the cover member 52 to the uppermost end position due to the biasing force of the coil spring 58. Thereby, the respective projected piece 52P of the cover member 52 rotates the legs 60L and 62L toward the respective of the guide wall portion, and the pressing surface portion 60T of the presser member 60 and the pressing surface portion 62T of the presser member 62 returns to a state wherein they are directly above the alignment plate 51. Thereafter, the pressing surface portions 60T and 62T are moved downward through the cutout 50C and brought into contact with the outer peripheral surface of the package of the semiconductor device DV without griding. Thereby, the pressing surface portion 60T and the pressing surface portion 62T press the semiconductor device DV toward the contact pin module 48. Accordingly, there is no risk in that the package of the semiconductor device DV is damaged by the pressing surface portion 60T of the presser member 60 and the pressing surface portion 62T of the presser member 62.

When the test signal is supplied to the input/output portion of the printed wiring board PB while keeping the cover member 52 at the test position, the test signal is supplied to the semiconductor device DV via the contact pin module 48. If the abnormality is detected in a circuit thereof, the abnormality detection signal issued from the semiconductor device DV is supplied to the external fault diagnosis device.

When the test of the semiconductor device has completed, the front end of the arm in the working robot is pushed downward against the biasing force of the coil spring 58 while being in contact with the upper surface of the cover member 52 in the same manner as described before so that the semiconductor device DV thus tested is taken out and a new one is mounted. The semiconductor device DV thus tested is removed from the alignment plate 51 by the conveyor arm, and the new semiconductor device DV to be tested is mounted in the same manner as described before.

Figure 18:
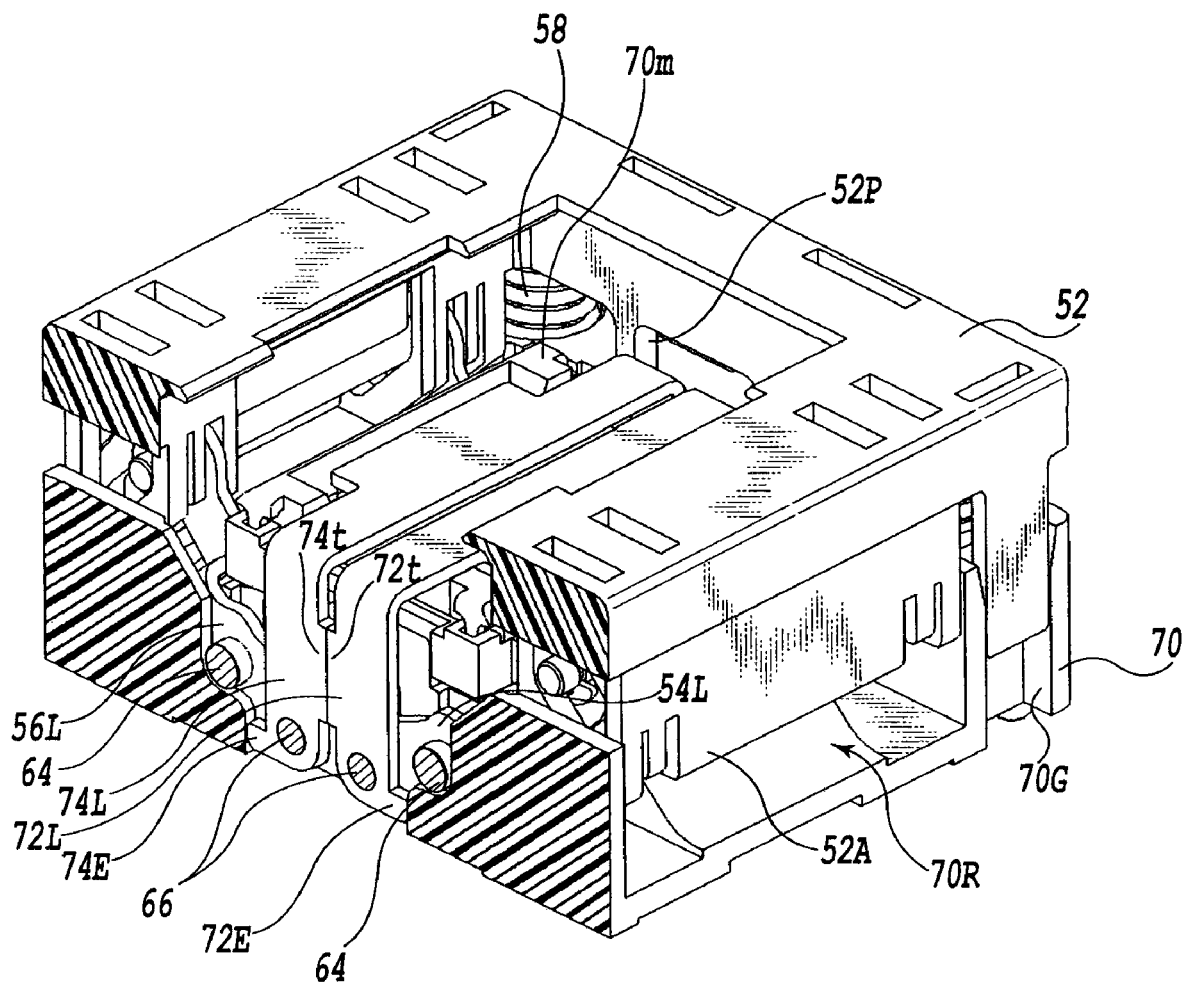
FIG. 18 is a perspective view of a socket for a semiconductor device according to the present invention provided with a modification of the presser member shown in FIG. 13.
Figure 19:
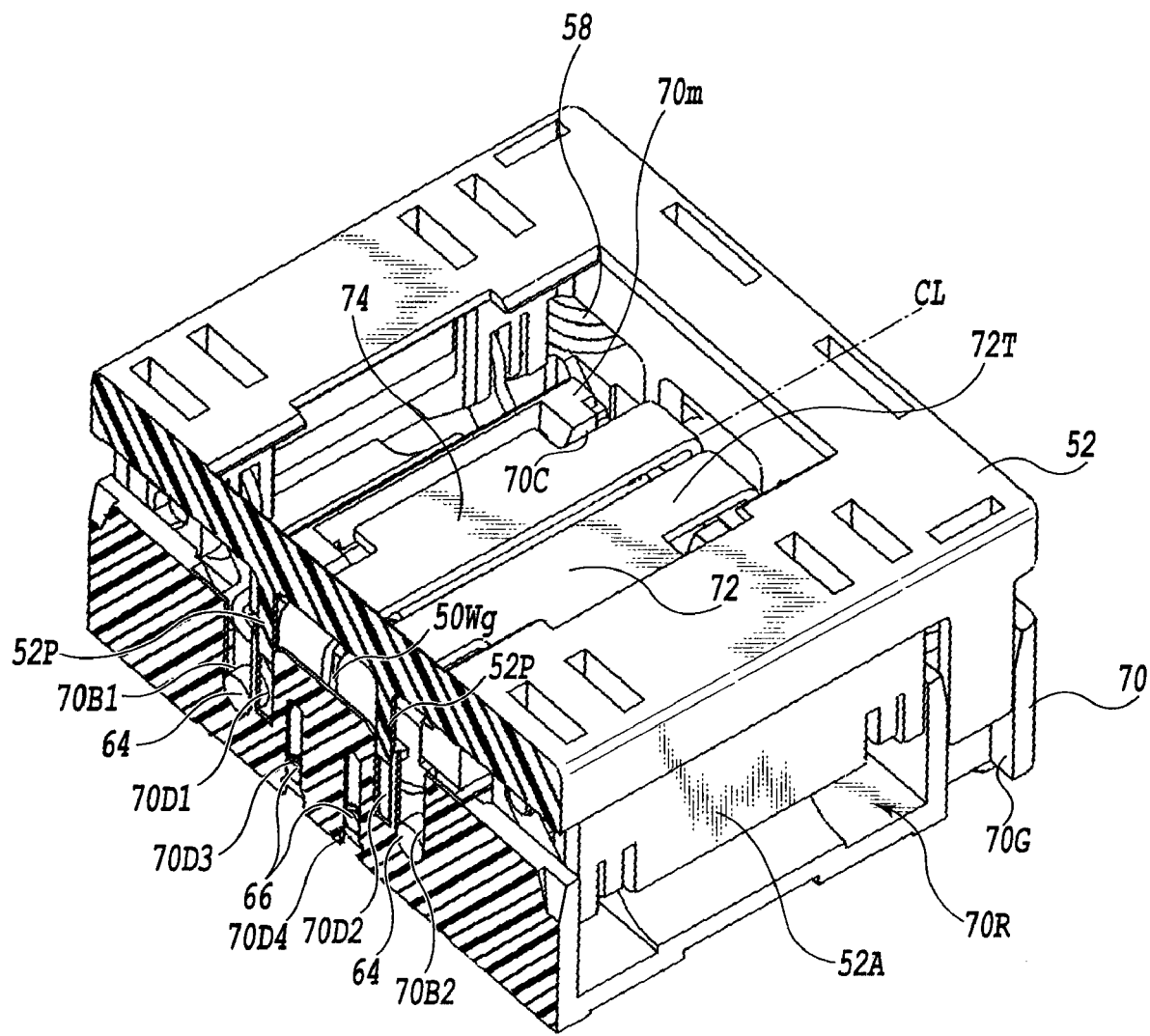
FIG. 19 is a perspective view illustrating a main portion of the embodiment shown in FIG. 18 together with a partial sectional view thereof.

In the second embodiment described above, while the guide wall portion 50Wg for restricting the position of the leg 60L of the presser member 60 and the leg 62L of the presser member 62 is formed between the leg 60L of the presser member 60 and the leg 62L of the presser member 62 at a position corresponding thereto, this is not limitative. For example, as shown in FIGS. 18 and 19, instead of forming such a guide wall portion in the socket body 70, presser members 72 and 74 may have contacting portions 72t and 74t in contact with each other. Thereby, in a state wherein the presser members 72 and 74 are located close to each other, the leg 72L of the presser member 72 and the leg 74L of the presser member 74 are held parallel to each other.

Note that in FIGS. 18 and 19, the same reference numerals are used for denoting the same elements as in the embodiment shown in FIG. 13, and the explanation thereof is eliminated.

On the outer periphery of respective side in the socket body 70, guide grooves 70G engaged with the respective guide nibs 52N of the cover member 52 are formed at a predetermined interval to be movable up and down. The guide groove 70G is formed generally perpendicular to the bottom surface of the socket body 70. At one end of the respective groove 70G, a front end of the guide nib 52N is locked when the cover member 52 is at the uppermost end position as shown in FIG. 18.

At positions on the inner periphery of the socket body 70 opposed to the respective legs 72L and 74L of the presser members 72 and 74, elongate grooves 70D3 and 70D4 for guiding ends of the respective coupling pins 66 described later are formed parallel to each other, as shown in FIG. 19. The grooves 70D and 70D4 are generally vertical to the bottom surface of the socket body 70. Also, on both sides of the grooves 70D3 and 70D4, grooves 70B1 and 70B2 for receiving one ends of the respective shafts 64 described later are formed generally parallel to the grooves 70D3 and 70D4. Furthermore, between the grooves 70B1 and 70D3 and between the grooves 70B2 and 70D4, grooves 70D1 and 70D2 are formed, respectively. In the grooves 70D1 and 70D2, projected pieces 52P of the cover member 52 described later are engaged in a movable manner when the cover member 52 is moved downward, as shown in FIG. 19.

In a generally middle portion of the socket body 50, a module accommodation portion for accommodating the contact pin module is formed. On the peripheral edge of the module accommodation portion, positioning projections 70m for guiding the semiconductor device to a predetermined position are formed at four positions, when corners of the outer periphery of the package of the mounted semiconductor device are engaged thereto. Between the positioning projections 70m, a pair of cutouts 70C are formed opposite to each other, for allowing the presser members 72 and 74 to pass therethrough.

On the periphery of the module accommodation portion, recesses 70R are formed opposite to each other. Into the recesses 70R, lower ends of the arm members 52A and 52B are selectively inserted.

Also, a spring receiving portion in which one end of the coil spring 58 described later is adjacently formed on the respective side of the wall portion wherein the respective recess 70R is formed.

In a predetermined gap defined between a portion on the outer periphery of the above-mentioned module accommodation portion wherein the cutout 70C is formed and the inner peripheral surface of the socket body 70, a link mechanism and the respective legs 72L of the presser member 72 and the respective legs 74L of the presser member 74 are arranged in a movable manner.

The presser members 72 and 74 have the same structure to each other and arranged in symmetry relative to a center line CL in FIG. 19, whereby the explanation will be done solely on the presser member 72 and that of the presser member 74 will be eliminated.

The presser member 72 is made of, for example, a stamped thin steel sheet to have a gate form provided with an opposed pair of legs 72L and a pressing surface portion 72T coupling one ends of both the legs 72L to each other. A mutual distance between the opposed pair of legs 72L is selected to define a predetermined gap relative to the outer periphery of the module accommodation portion.

The coupling pin 66 is provided at a lower end of the respective leg 72L. One end of the coupling pin 66 is engaged with a branch provided at one end of the link member 56L or 56R.

A lower end of the respective leg 72L has a hook shape to form an engagement portion 72E to be selectively engageable with a lower end of the above-mentioned projected piece 52P of the cover member 52. On the other side of the respective leg 72L opposed to one side wherein the engagement portion 72E is formed, a contacting portion 72t bulged from this side at a predetermined height is formed.

Accordingly, the respective leg 72L are supported between the projected pieces 52P of the cover member 52 to be movable upward and downward while being in contact with the respective legs 74L of the presser member 74 via the contacting portions 72t and 74t. Also, the respective legs 72L of the presser member 72 are rotatable about the coupling pin 66 at a predetermined gap from the outer periphery of the module accommodation portion.

Also in the operation in such embodiments, since the same operation and effect are resulted as in the above-mentioned second embodiment, the redundant explanation thereof will be eliminated.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A socket for a semiconductor device comprising:
   a socket body having a semiconductor device mounting portion for detachably mounting a semiconductor device and a group of contact terminals electrically connected to terminals of said semiconductor device;
   a presser member having a pressing surface portion formed generally parallel to a contour surface of said semiconductor device and said presser member being supported in said socket body so that said pressing surface portion is moved in the direction vertical to said contour surface and brought into contact with said contour surface when moving closer to the contour surface of said semiconductor device mounted to said semiconductor device mounting portion or rotated after said pressing surface portion is away from the contour surface;
   a cover member supported by said socket body to be movable upward and downward and having an opening for allowing said semiconductor device to pass therethrough when said semiconductor device is mounted or demounted;
   means for biasing said cover member in the direction away from said socket body; and
   a link mechanism coupled to said cover member and said presser member, for holding said pressing surface of said presser member on the contour surface of said semiconductor device or releasing the same therefrom in synchronization with moving up and down of said cover member.

2. The socket for a semiconductor device as claimed in claim 1, wherein legs of said presser member is slidably supported between a guide wall surface formed in said socket body and projecting pieces formed in said cover member.

3. A socket for a semiconductor device comprising:
   a socket body having a semiconductor device mounting portion for detachably mounting a semiconductor device and a group of contact terminals electrically connected to terminals of said semiconductor device;
   a first presser member having a pressing surface portion formed generally parallel to a contour surface of said semiconductor device and said first presser member being supported in said socket body so that said pressing surface portion is moved in the direction vertical to said contour surface and brought into contact with said contour surface when moving closer to the contour surface of said semiconductor device mounted to said semiconductor device mounting portion or rotated after said pressing surface portion is away from the contour surface;
   a second presser member arranged to be moved closer to or away from said first presser member in synchronization with the operation of said first presser member, said second presser member having a pressing surface portion formed generally parallel to a contour surface of said semiconductor device and said second presser member being supported in said socket body so that said pressing surface portion is moved in the direction vertical to said contour surface and brought into contact with said contour surface when moving closer to the contour surface of said semiconductor device mounted to said semiconductor device mounting portion or rotated after said pressing surface portion is away from the contour surface;
   a cover member supported by said socket body to be movable upward and downward and having an opening for allowing said semiconductor device to pass therethrough when said semiconductor device is mounted or demounted;
   means for biasing said cover member in the direction away from said socket body; and
   a link mechanism coupled to said cover member and said first and second presser members, for holding said pressing surfaces of said presser members on the contour surface of said semiconductor device or releasing the same therefrom in synchronization with moving up and down of said cover member.

4. The socket for a semiconductor device as claimed in claim 3, wherein legs of said first presser member and said second presser member are slidably supported between a guide wall surface formed in said socket body and projected pieces formed in said cover member.

5. The socket for a semiconductor device as claimed in claim 1, wherein a rotational center axis of said leg of said presser member is vertical to a part of said socket body wherein a group of contact terminals are disposed.

6. The socket for a semiconductor device as claimed in claim 5, wherein a rotational center axis of said leg of said presser member is vertical to a center line passing through a centroid of a portion of said socket body wherein a group of contact terminals of said socket body are disposed.

7. The socket for a semiconductor device as claimed in claim 3, wherein rotational center axes of said first presser member and said second presser member are vertical to a portion wherein the group of contact terminals of said socket body are disposed.

8. The socket for a semiconductor device as claimed in claim 7, wherein rotational center axes of said first presser member and said second presser member are symmetrically arranged on a plane of symmetry containing a center line passing through a centroid in a part wherein the group of contact terminals of said socket body are disposed.

* * * * *